United States Patent
Takahashi

(10) Patent No.: US 6,927,133 B2
(45) Date of Patent: Aug. 9, 2005

(54) SEMICONDUCTOR MEMORY CAPABLE OF BEING DRIVEN AT LOW VOLTAGE AND ITS MANUFACTURE METHOD

(75) Inventor: Koji Takahashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/649,994

(22) Filed: Aug. 28, 2003

(65) Prior Publication Data

US 2004/0046212 A1 Mar. 11, 2004

Related U.S. Application Data

(62) Division of application No. 09/973,743, filed on Oct. 11, 2001, now Pat. No. 6,642,586.

(30) Foreign Application Priority Data

Feb. 7, 2001 (JP) .......................... 2001-031320

(51) Int. Cl.[7] ............................................. H01L 21/336
(52) U.S. Cl. ........................................ 438/267; 257/315
(58) Field of Search ................................ 438/142, 197, 438/201, 199, 230, 241, 257–267, 277, 279, 283, 287, 288, 301, 303, 304; 257/314–324, E21.179, E21.18, E21.422, E21.679, E21.68

(56) References Cited

U.S. PATENT DOCUMENTS

| | | | |
|---|---|---|---|
| 5,408,115 A | 4/1995 | Chang | 257/324 |
| 5,467,308 A | 11/1995 | Chang et al. | 365/185.01 |
| 5,838,041 A * | 11/1998 | Sakagami et al. | 257/324 |
| 5,969,383 A | 10/1999 | Chang et al. | 257/316 |
| 6,248,633 B1 | 6/2001 | Ogura et al. | 438/267 |
| 6,335,554 B1 * | 1/2002 | Yoshikawa | 257/316 |

FOREIGN PATENT DOCUMENTS

| | | |
|---|---|---|
| JP | 05-326893 | 12/1993 |
| JP | 09-252059 | 9/1997 |
| JP | 2001-156188 | 6/2001 |
| KR | 2000-0076792 | 12/2000 |

OTHER PUBLICATIONS

Boaz Eitan et al., NROM: A Novel Localized Trapping, 2–Bit Nonvolatile Memory Cell, IEEE Electron Device Letters, Nov., 2000, vol. 21, No. 11, pp. 543–545.

* cited by examiner

*Primary Examiner*—Brook Kebede
(74) *Attorney, Agent, or Firm*—Armstrong, Kratz, Quintos, Hanson & Brooks, LLP

(57) ABSTRACT

A gate insulating film is formed in a partial area of the surface of a semiconductor substrate, and on this gate insulating film, a gate electrode is formed. An ONO film is formed on the side wall of the gate electrode and on the surface of the semiconductor substrate on both sides of the gate electrode, conformable to the side wall and the surface. A silicon nitride film of the ONO film traps carriers. A conductive side wall spacer faces the side wall of the gate electrode and the surface of the semiconductor substrate via the ONO film. A conductive connection member electrically connects the side wall spacer and gate electrode. Source and drain regions are formed in the surface layer of the semiconductor substrate in areas sandwiching the gate electrode. A semiconductor device is provided which can store data of two bits in one memory cell and can be driven at a low voltage.

4 Claims, 24 Drawing Sheets

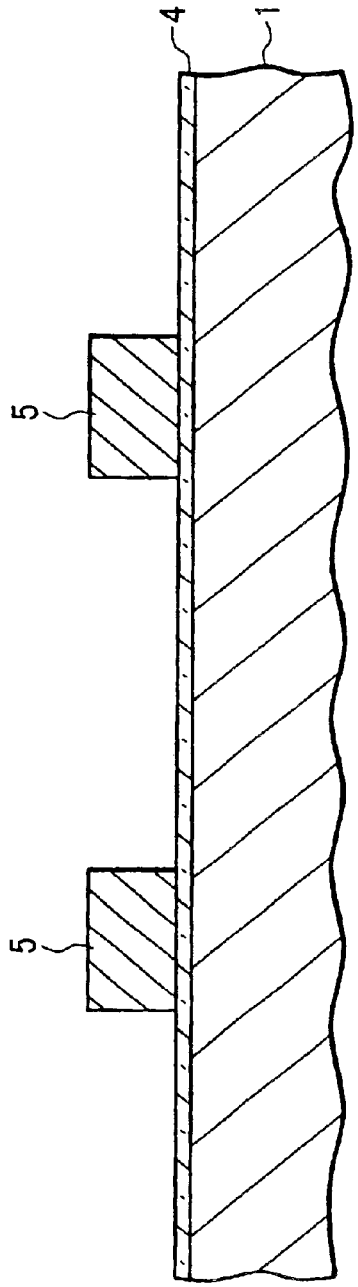
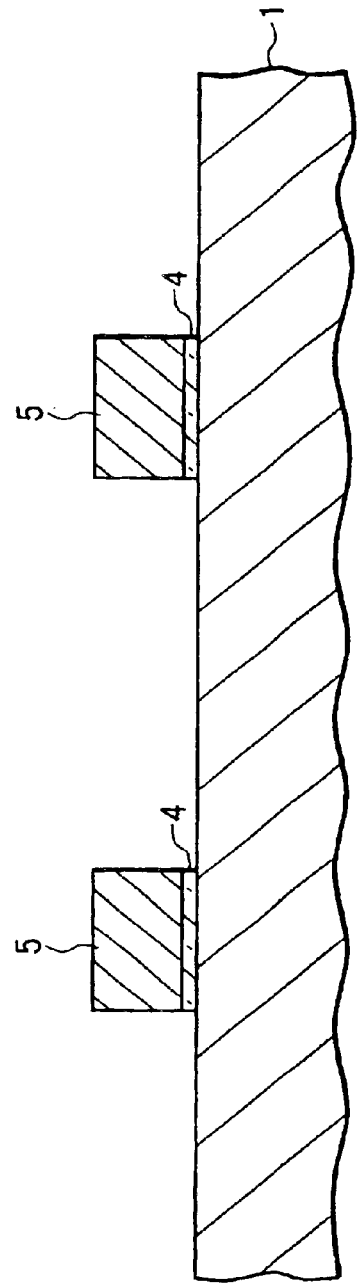
FIG.5A
FIG.5B

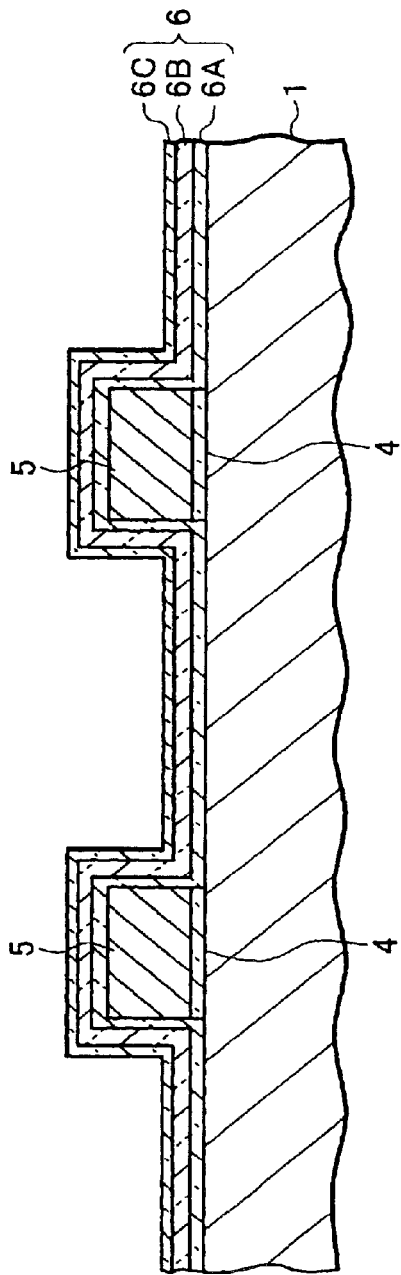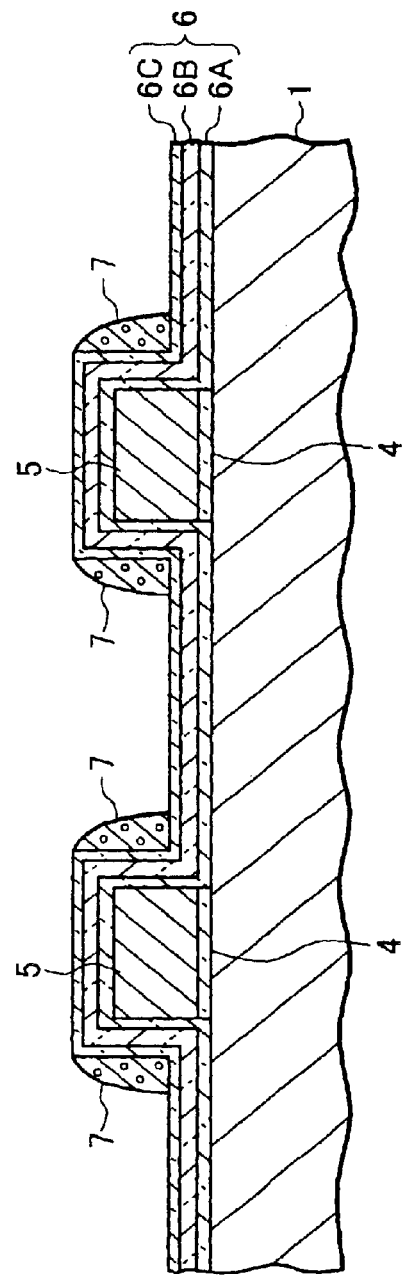

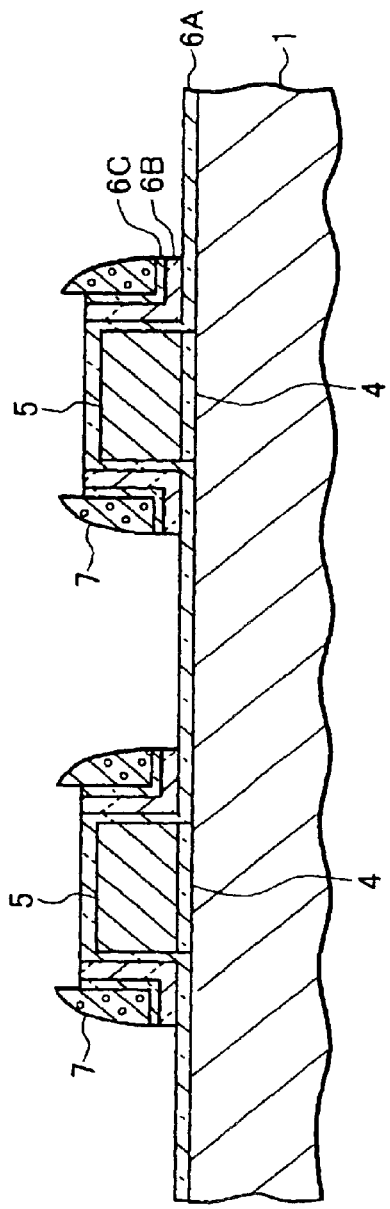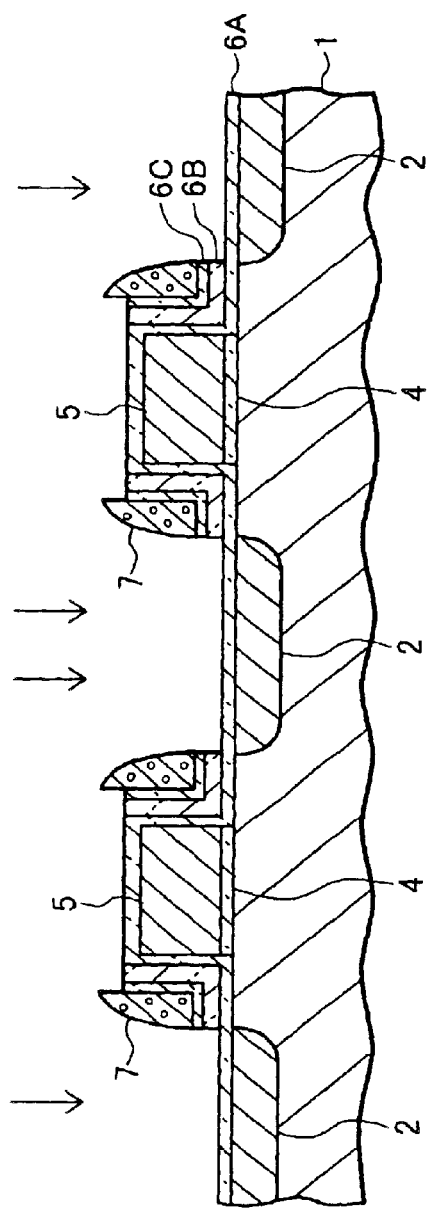

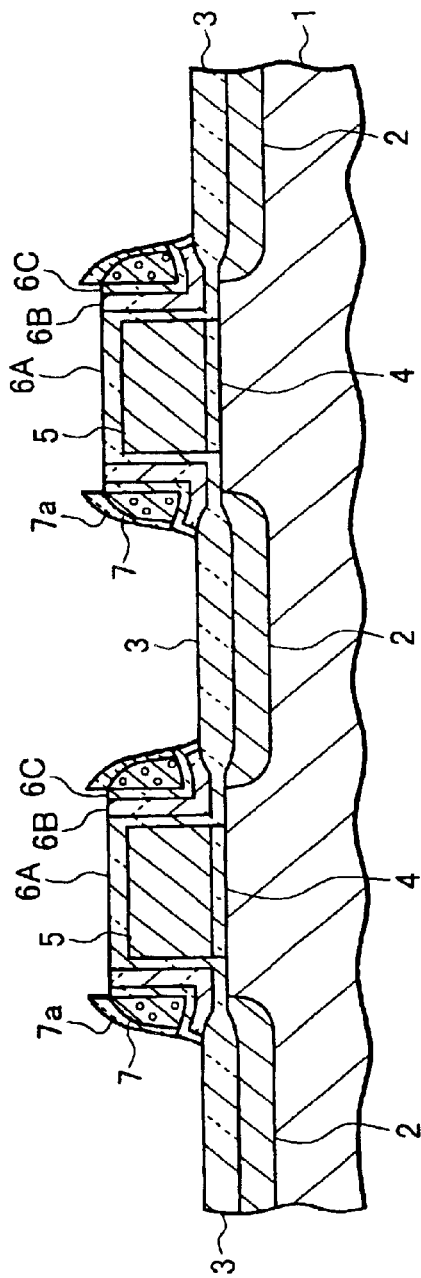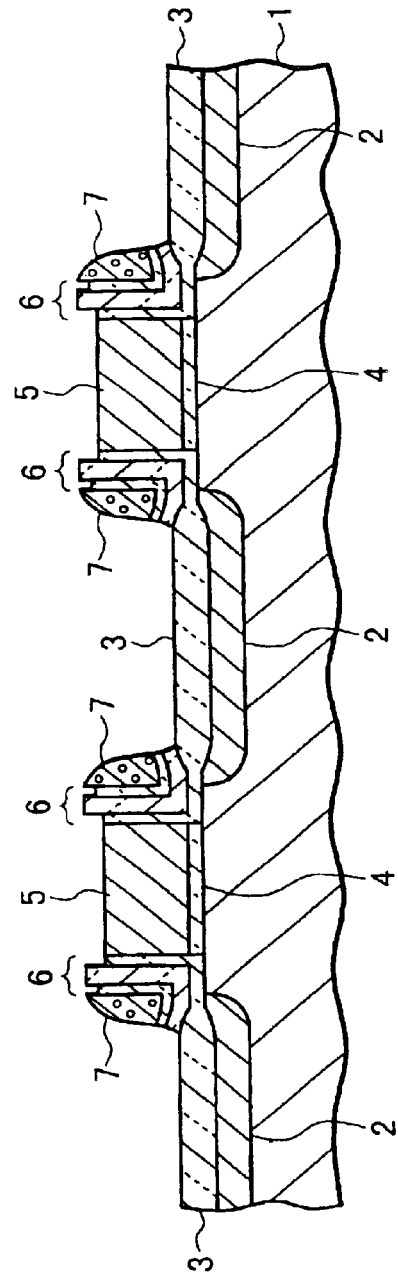

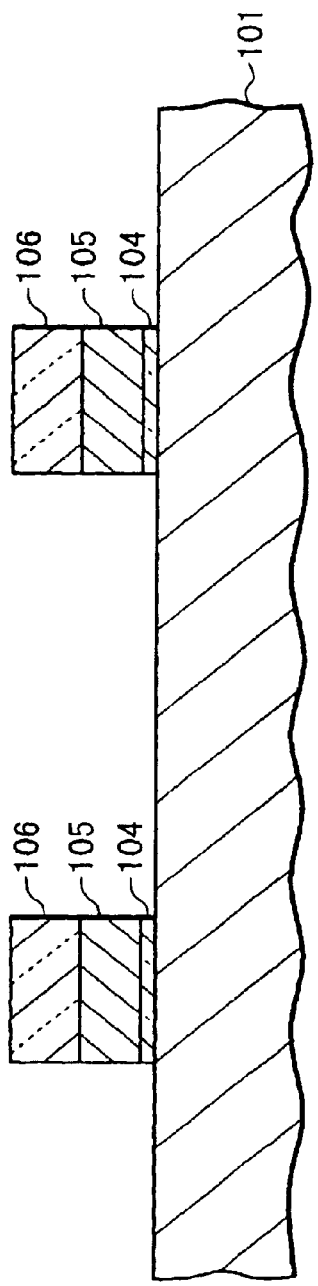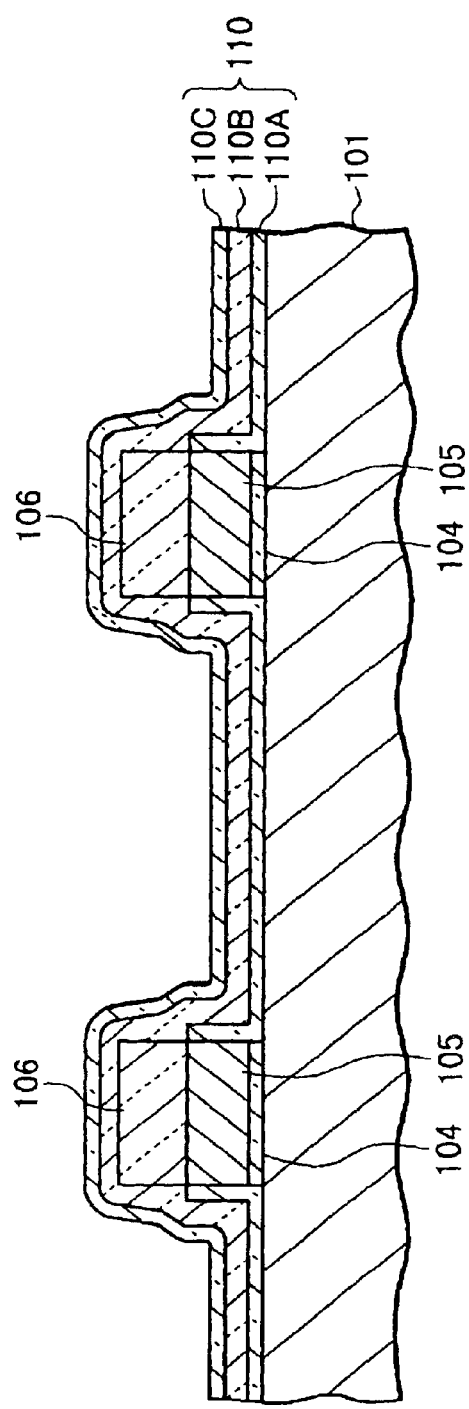

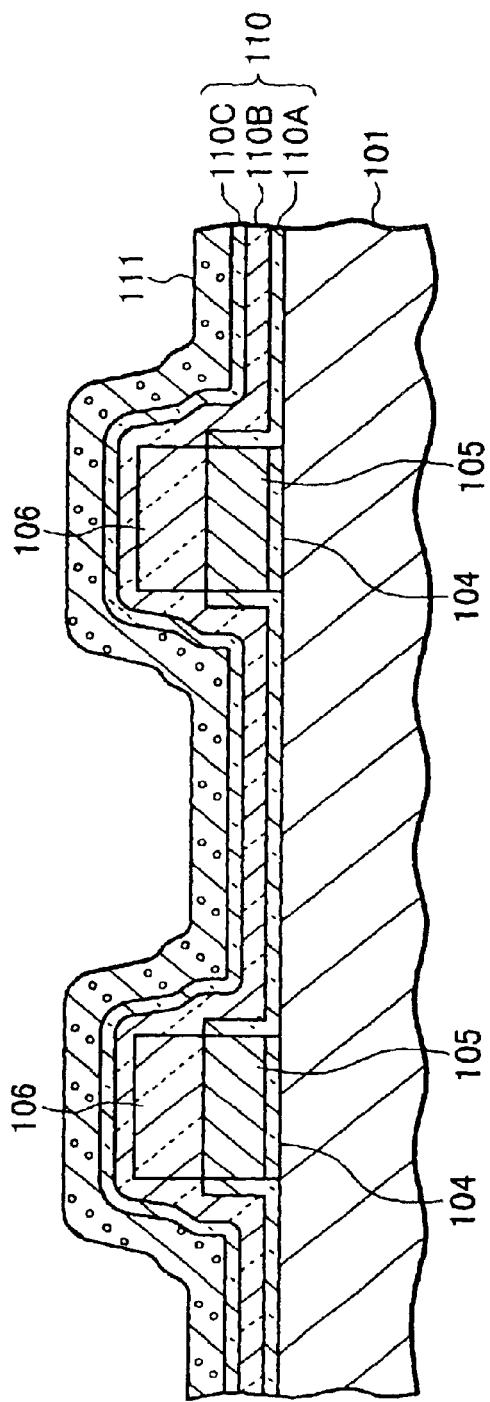
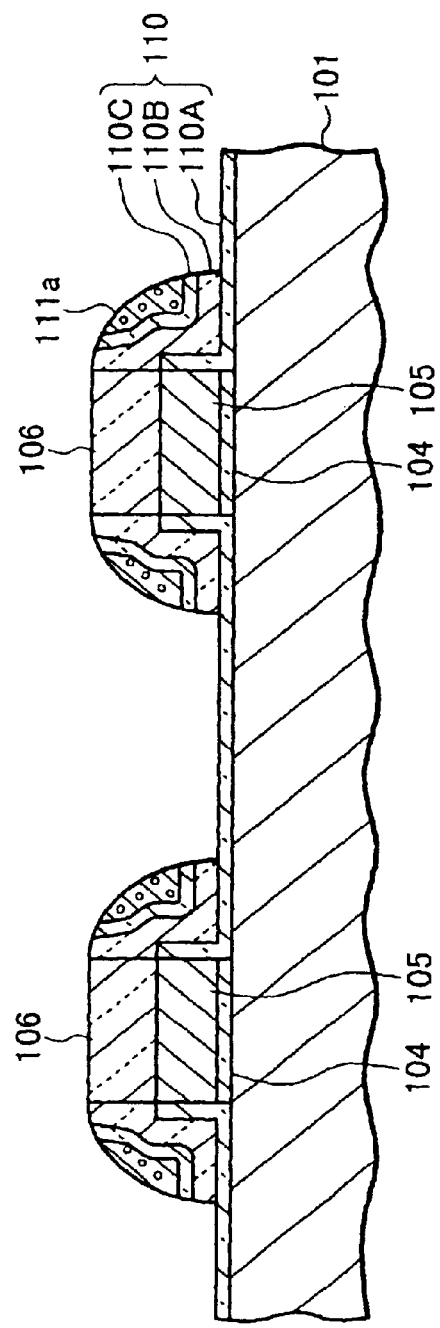
FIG.6C
FIG.6D

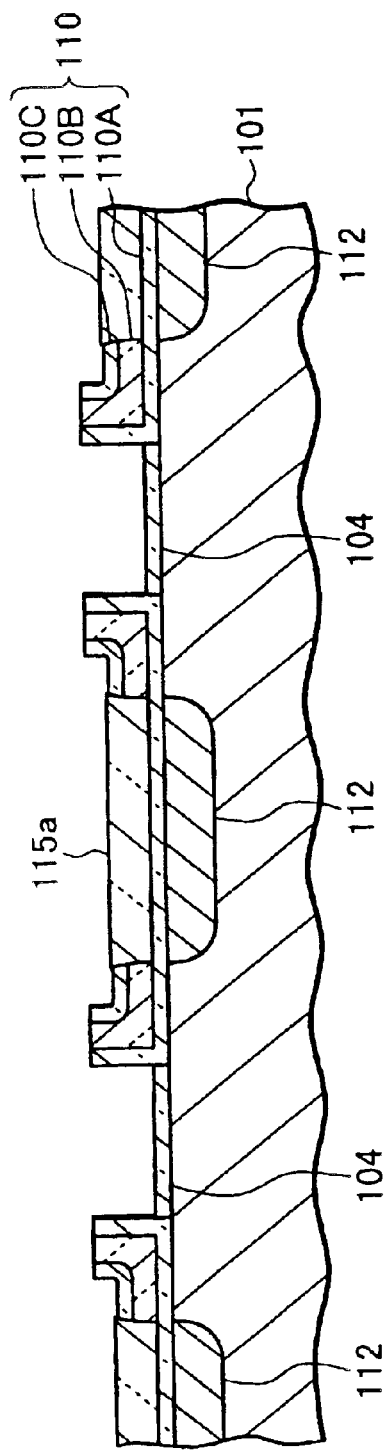
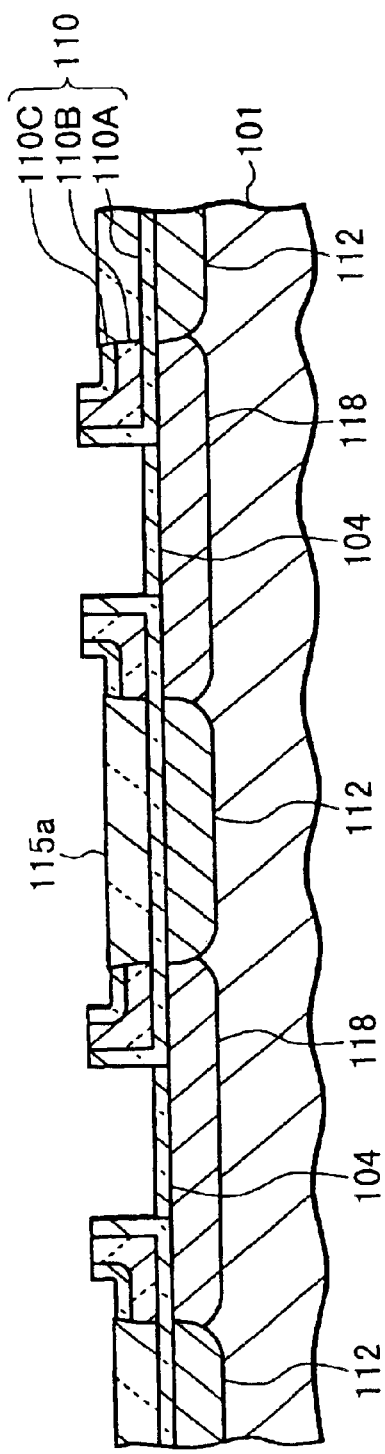
FIG.6K
FIG.6L

US 6,927,133 B2

SEMICONDUCTOR MEMORY CAPABLE OF BEING DRIVEN AT LOW VOLTAGE AND ITS MANUFACTURE METHOD

This is a Division of Ser. No. 09/973,743 filed on Oct. 11, 2001, now U.S. Pat. No. 6,642,586.

This application is based on Japanese Patent Application 2001-031320, filed on Feb. 7, 2001, the entire contents of which are incorporated herein by reference.

BACKGROUND OF THE INVENTION

1) Field of the Invention

The present invention relates to a semiconductor device and its manufacture method, and more particularly to a semiconductor device for storing data by trapping carriers in the middle layer of a three-layer structure disposed above the channel region of an FET.

2) Description of the Related Art

FIG. 11A is a cross sectional view showing one example of a conventional flash memory cell. In a surface layer of a p-type silicon substrate 700, an n-type source region 701 and an n-type drain region 702 are formed. Between the source and drain regions, a channel region 703 is defined. The surfaces of the source and drain regions 701 and 702 are covered with a local oxide film 705.

On the surface of the channel region 703, a lamination film (hereinafter called an ONO film) 706 is formed which is made of a lower silicon oxide film 706A, a silicon nitride film 706B and an upper silicon oxide film 706C stacked in this order. A gate electrode 707 is formed on the local oxide film 705 and ONO film 706.

Next, the operation principle of the flash memory shown in FIG. 11A will be described.

In writing data, a source voltage Vs to be applied to the source region 701 and a substrate voltage Vsub are set to 0 V, a drain voltage Vd to be applied to the drain region 702 is set to 5 V, and a gate voltage Vg to be applied to the gate electrode 707 is set to 10 V. Channel hot electron injection occurs near the boundary between the channel region 703 and drain region 702 so that electrons are trapped in the silicon nitride film 706B.

By reversing the voltages applied to the source region 701 and drain region 702, electrons can be trapped in the silicon nitride film 706B near the boundary between the channel region 703 and source region 701. It is therefore possible to store data of two bits in one memory cell.

In reading data, the drain voltage Vd and substrate voltage Vsub are set to 0 V, the source voltage Vs is set to 1V and the gate voltage Vg is set to 3.3 V. In the state that electrons are trapped in the silicon nitride film 706B, an inversion region of a carrier concentration distribution is not formed in the channel region 703 in its end area on the side of the drain region 702. Current does not flow through the source and drain. In the state that electrons are not trapped in the silicon nitride film 706B, drain current flows through the source and drain. Since a depletion region extends from the source region 701 to the channel region 703 near the source region 701, the drain current is hardly influenced by a presence/absence of trapped carriers on the source region 701 side.

By reversing the source voltage Vs and drain voltage Vd, it is possible to detect whether electrons are trapped in the silicon nitride film 706B near the boundary between the source region 701 and channel region 703.

In erasing data, the substrate voltage Vsub is set to 0 V, the source voltage Vs is set to 5 V or a floating state, the drain voltage Vd is set to 5 V, and the gate voltage Vg is set to −5 V. Holes are injected into the silicon nitride film 706B near the boundary between the drain region 702 and channel region 703, because of inter-band tunneling. Charges of trapped electrons are therefore neutralized.

By reversing the source voltage Vs and drain voltage Vd, holes can be injected into the silicon nitride film 706B near the boundary between the source region 701 and channel region 703.

The density distribution of electrons trapped in the silicon nitride film 706B by CHE injection has a peak toward the center of the channel region 703 more than the density distribution of holes injected by inter-band tunneling. In order to neutralize charges of electrons distributed toward the center of the channel region 703, a fairly large number of holes are required to be injected.

As the read/erase operations of a flash memory are repeated, the density distribution of electrons trapped in the silicon nitride film 706B is considered to extend toward the center of the channel region 703. Therefore, as the write/erase operations are repeated, it takes a long time to erase data by injecting holes.

During data write, it can be considered that in addition to CHE injection, secondary collision ionized hot electron injection occurs. When secondary collision ionized hot electron injection occurs, electrons are trapped in the silicon nitride film 706B in an area above the center of the channel region 703. The electrons trapped in the silicon nitride film 706B in the area above the center of the channel region 703 cannot be removed by hole injection. Therefore, as the write/erase operations are repeated, the threshold value gradually rises. According to evaluation experiments by the present inventor, although the write threshold value and erase threshold value of a memory cell immediately after manufacture were about 3.8 V and 2.5 V, respectively, the threshold values rose to about 4.6 V and 3.25 V after ten thousands repetitions of the write/erase operations.

FIG. 11B is a cross sectional view showing a flash memory disclosed in JP-A-9-252059.

In a surface layer of a p-type silicon substrate 710, an n-type source region 711 and an n-type drain region 712 are formed. Between the source and drain regions, a channel region 714 is defined. At the interface between the drain region 712 and the silicon substrate 710, an n-type impurity doped region 713 of a low impurity concentration is formed.

A gate insulating film 715 is formed on the surface of the channel region 714, and on this gate insulating film, a gate electrode 716 is formed. The gate insulating film 715 and gate electrode 716 are disposed spaced apart by some distance from both the source region 711 and drain region 712. An end portion of the drain electrode 716 on the drain region 712 side overlaps a portion of the low impurity concentration region 713.

An ONO film 717 covers the side walls of the gate electrode 716, the substrate surface between the gate electrode 716 and source region 711, and the substrate surface between the gate electrode 716 and drain region 712. The ONO film 717 has a three-layer structure of a silicon oxide film 717A, a silicon nitride film 717B and a silicon oxide film 717C. Side wall spacers 718 made of silicon oxide are formed on the surface of the ONO film 717.

If the impurity doped region 713 of the low impurity concentration is not formed, even if a voltage equal to or greater than the threshold voltage is applied to the gate electrode 716, a channel is not formed in the substrate surface layer between the gate electrode 716 and drain region 712. Since the memory cell shown in FIG. 11B has the n-type low impurity concentration region 713, current flows between the source and drain. On the source region 711 side, a depletion layer extends from the source region 711 to the side of the gate electrode 716 so that it is not necessary to form such a low impurity concentration region on this side.

In writing data, a positive voltage is applied to the source region 711 and a higher positive voltage is applied to the gate electrode 716 to make the drain region 712 enter a floating state. Electrons are trapped in the silicon nitride film 717B on the source region 711 side by avalanche hot electron injection. A voltage of 0 V may be applied to the drain region 712 to utilize CHE injection.

In erasing data, a positive voltage is applied to the source region 711 and a negative voltage is applied to the gate electrode 716. Holes are trapped in the silicon nitride film 717B on the source region 711 side by avalanche hot hole injection. Charges of trapped electrons are therefore neutralized. A gate voltage having a larger absolute value may be applied to drain electrons trapped in the silicon nitride film 717B to the channel region 714 by Fowler-Nordheim tunneling (FN tunneling).

In the conventional memory cell shown in FIG. 11B, the silicon nitride film is not disposed over the center of the channel region 714. It is therefore possible to prevent the density distribution of electrons trapped in the silicon nitride film from extending to the area above the center of the channel region 714. However, since the low impurity concentration region 713 is disposed on the drain region 712 side, electrons cannot be injected into the silicon nitride film 717B on the drain region 712 side. From this reason, only one bit of data can be stored in one memory cell.

FIG. 11C is a cross sectional view of a memory cell which is an improved version of the memory cell shown in FIG. 11B. In the memory cell shown in FIG. 11B, the side wall spacer 718 is made of silicon oxide. In the memory cell shown in FIG. 11C, a side wall spacer 720 made of polysilicon is used. Therefore, the substrate surface layer between the gate electrode 716 and drain region 710 is capacitively coupled to the gate electrode via the side wall spacer 720. This capacitive coupling enables to form the channel between the gate electrode 716 and drain region 712 so that the low impurity concentration region 713 shown in FIG. 11B is not formed.

The principle of writing and erasing data for the memory cell shown in FIG. 11C is similar to the operation principle of the memory cell shown in FIG. 11B. Since a low impurity concentration region is not disposed between the drain region 712 and channel region 714, data of two bits can be stored in the memory cell similar to the memory cell shown in FIG. 11A.

In the memory cell shown in FIG. 11C, a voltage applied across the source region 711 and gate electrode 716 is divided by a capacitor between the gate electrode 716 and side wall spacer 720 and a capacitor between the side wall spacer 720 and channel region 714. It is therefore necessary to raise the gate voltage when data is written or erased. If the gate voltage is raised too high, the gate insulating film 715 may be dielectrically broken.

If an electrostatic capacitor between the gate electrode 716 and side wall spacer 720 and an electrostatic capacitor between the side wall spacer 720 and channel region 714 change their capacitance, an electric field generated between the side wall spacer 720 and channel region 714 fluctuates, which may result in write error or erase error.

SUMMARY OF THE INVENTION

It is an object of the present invention to provide a semiconductor device capable of storing data of two bits in one memory cell and being driven at a low voltage, and to its manufacture method.

According to one aspect of the present invention, there is provided a semiconductor device comprising: a semiconductor substrate; a gate insulating film formed on a partial area of a surface of said semiconductor substrate; a gate electrode formed on said gate insulating film; a lamination film formed on a side wall of said gate electrode and on the surface of said semiconductor substrate on both sides of said gate electrode, conformable to the side walls and the surface, said lamination film having a structure of at least three layers, each of the three layers being made of insulating material, and a middle layer being made of material easier to trap carriers than other two layers; a side wall spacer made of conductive material and facing the side wall of said gate electrode and the surface of said semiconductor substrate via said lamination film; a conductive connection member electrically connecting said side wall spacer and said gate electrode; and impurity doped regions formed in a surface layer of said semiconductor substrate in areas sandwiching said gate electrode along a first direction parallel to the surface of said semiconductor substrate, edges of said impurity doped regions being disposed under said lamination film and not reaching boundaries of said gate electrode.

An FET has the impurity doped regions as its source and drain regions. A gate voltage is directly applied to the side wall spacers to control the carrier density in the channel region under the side wall spacers. If carriers are trapped in the lamination film by CHE injection and the like, the threshold value changes. Presence/absence of trapping carriers correspond to data of 0 and 1. By detecting a change in the threshold value, data can be read. By injecting carriers having charges opposite to those of the trapped carriers into the lamination film, stored data can be erased.

According to another aspect of the present invention, there is provided a semiconductor device comprising: a gate insulating film formed on a channel region defined in a surface layer of a semiconductor substrate; source and drain regions formed in the surface layer in both side areas of the channel region; carrier trap films covering first and second areas and made of material easier to trap carriers than the gate insulating film, an upper surface of the gate insulating film having the first area on the source region side, the second area on the drain region side and a third area between the first and second areas; a coating film made of insulating material and covering surfaces of the carrier trap films; and a gate electrode continuously covering at least a surface from a boundary between the source region and channel region to a boundary between the drain region and channel region among surfaces of the coating film and the gate insulating film on the third area.

When carriers are trapped in the carrier trap film, the threshold value changes. By detecting a change in the threshold value, presence/absence of trapped carriers can be judged. If carriers are once trapped in the region near the center of the channel region, it becomes difficult to remove the trapped carriers. Since the carrier trap film is not disposed in the third area, trapped carriers can be removed easily.

According to another aspect of the present invention, there is provided a semiconductor device comprising: source and drain regions formed in a surface layer of a semiconductor substrate and spaced apart by some distance; an intermediate region formed in the surface layer between said source and drain regions, spaced apart by some distance from both said source and drain regions, and doped with impurities of the same conductivity type as said source and drain regions; gate insulating films covering a channel region between said source and intermediate regions and a channel region between said drain and intermediate regions; a first film covering said source, drain and intermediate regions and made of insulating material, said first film being thicker than said gate insulating films; a carrier trap film formed on each of the gate insulating films and made of material easier to trap carriers than said gate insulating films; a coating film made of insulating material and covering a surface of each of said carrier trap films; and a gate electrode covering said coating film and first film disposed in an area from one of the channel regions to the other of the channel regions via the intermediate region.

Drain current flows via the intermediate region. Since the intermediate region has the conductivity type same as that of the source and drain regions, drain current is hardly influenced even if carriers are trapped in the region over the intermediate area. Accordingly, even if carriers are trapped in an insulating film near the central area between the source and drain regions, the threshold value hardly changes.

As above, a conductive member is disposed on the lamination film including a carrier trap film, and a gate voltage is directly applied to the conductive member. It is therefore possible to write and erase data at a relatively low voltage. The carrier trap layer is not disposed over the center of the channel region or the intermediate region doped with impurities is disposed in the central area of the channel region. A change in the threshold voltage is therefore small even if write/erase operations are repeated.

BRIEF DESCRIPTION OF THE DRAWINGS

FIGS. 5A to 5H are cross sectional views of a substrate illustrating a method of manufacturing a semiconductor device according to the first embodiment.

FIGS. 6A to 6L are cross sectional views of a substrate illustrating a method of manufacturing a semiconductor device according to a second embodiment.

DETAILED DESCRIPTION OF THE PREFERRED EMBODIMENTS

Figure 1:
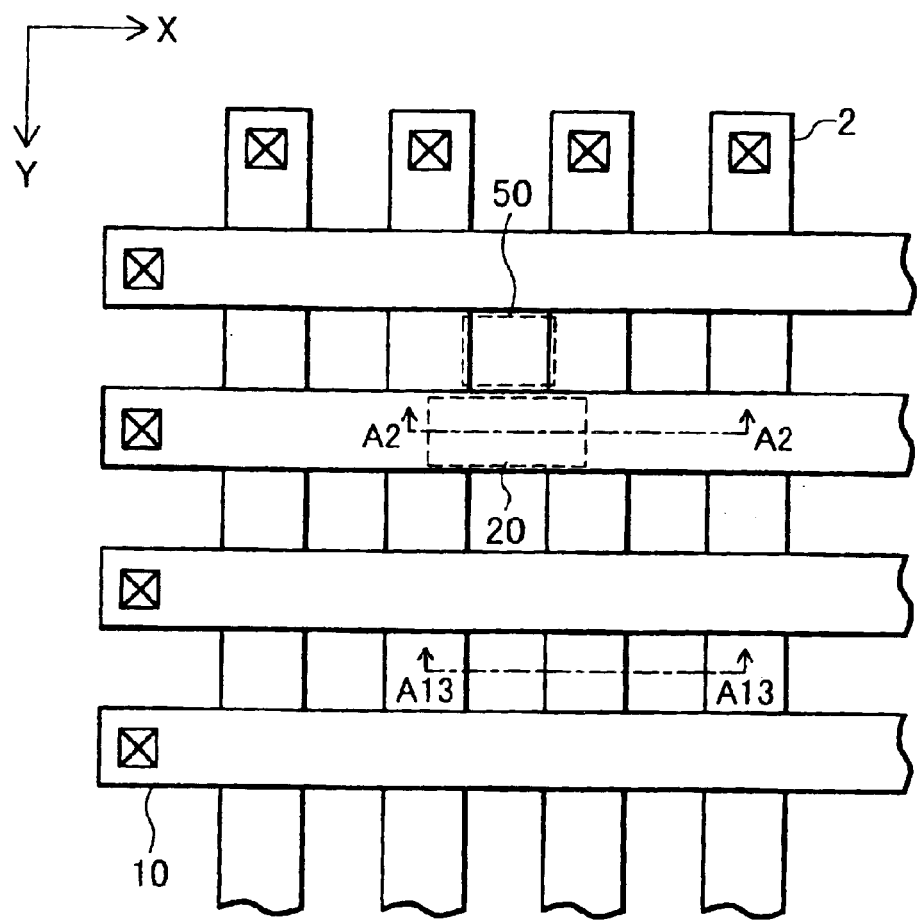
FIG. 1 is a plan view of a semiconductor device according to a first embodiment.

FIG. 1 is a schematic plan view of a semiconductor device according to a first embodiment of the invention. An X-Y rectangular coordinate system is defined on the surface of a silicon substrate.

In the surface layer of a p-type silicone substrate, a plurality of n-type impurity doped regions 2 are disposed in parallel. Each impurity doped region 2 extends along the direction in parallel to the Y-axis. A plurality of gate lines 10 are disposed in parallel on the surface of the silicon substrate. Each gate line 10 is parallel to the X-axis. In each cross area between the gate line 10 and impurity doped region 2, they are electrically insulated from each other.

In each cross area between a pair of adjacent impurity doped regions 2 and gate line 10, a field effect transistor (FET) 20 is disposed. In the surface layer between the channel regions of two FET's disposed in parallel to the Y-axis, a channel stopper region 50 is disposed. The channel stopper region 50 is a p-type impurity doped region whose impurity concentration is higher than that of the silicon substrate. The channel stopper region 50 electrically insulates the channel regions of two FET's disposed on both sides of the channel stopper region.

Figure 2:
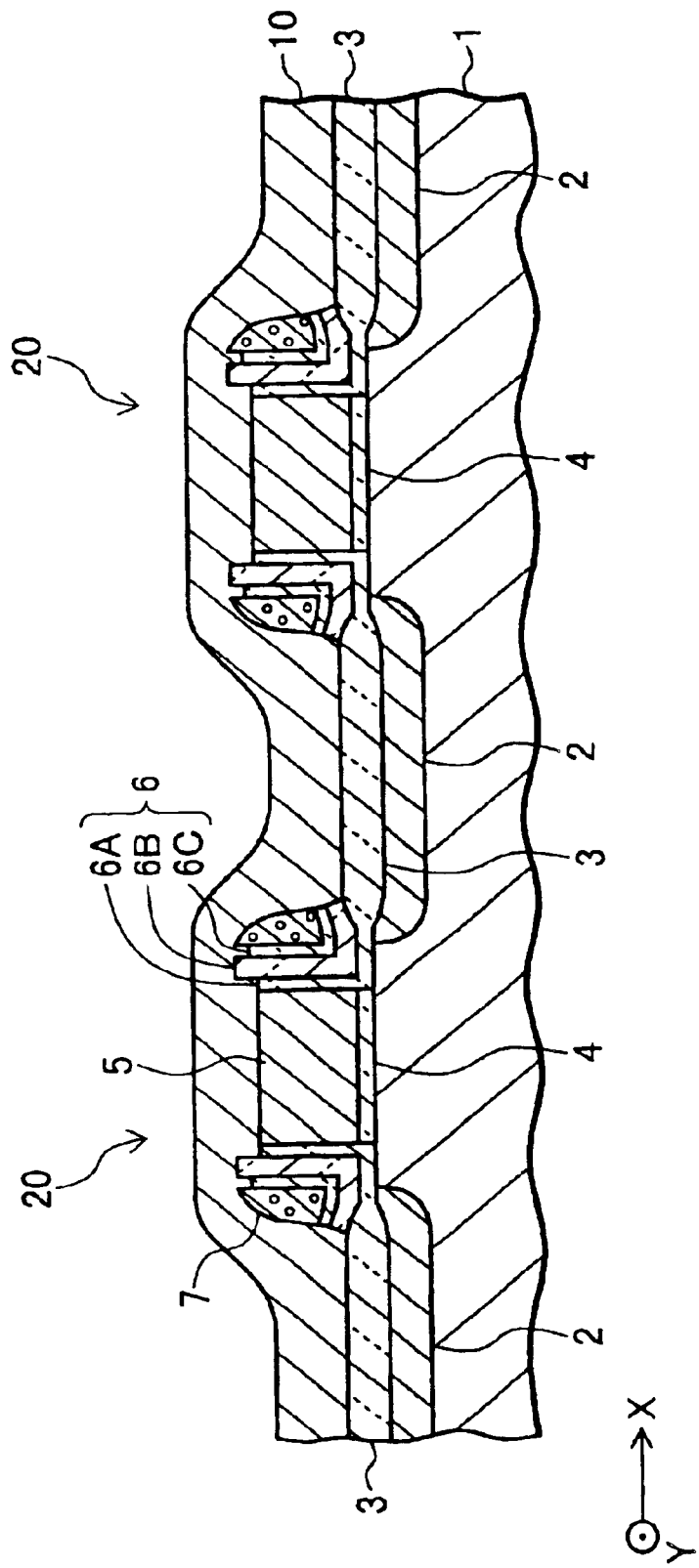
FIG. 2 is a cross sectional view of the semiconductor device of the first embodiment.

FIG. 2 is a cross sectional view taken along one-dot chain line A2—A2. In the surface layer of the p-type silicon substrate 1, a plurality of n-type impurity doped regions 2 are disposed extending along the Y-axis direction. On the surface of the impurity doped region 2, an insulating film 3 of silicon oxide is formed.

On the surface of the substrate between two adjacent impurity doped regions 2, a gate insulating film 4 of silicon oxide is formed. The insulating film 3 is thicker than the gate insulating film 4. The gate insulating film 4 is disposed spaced apart from both-side impurity doped regions 2 by some distance. On the gate insulating film 4, a gate electrode 5 of amorphous silicon is formed. A lamination film (ONO film) 6 is formed on the side walls of the gate electrode 5 and on the substrate surfaces between the gate electrode 5 and impurity doped regions 2. The ONO film 6 has a three-layer structure of a silicon oxide film 6A, a silicon nitride film 6B and a silicon oxide film 6C stacked in this order. The ONO film 6 is being formed conformable to the side walls of the gate electrode 5 and the substrate surfaces. The impurity doped region 2 extends laterally from the boundary of the ONO film 6 to some depth of the substrate and does not reach the boundary of the gate electrode 5. The insulating film 3 extends along the interface between the ONO film 6 and impurity doped region 2 to a depth shallower than the boundary of the impurity doped region 2.

A side wall spacer film 7 of amorphous silicon is formed on the surface of the ONO film 6. The side wall space 7 faces the side wall of the gate electrode 5 and the surface of the silicon substrate 1 via the ONO film 6.

Gate lines 10 extending along the X-axis direction are formed on the silicon substrate. An FET 20 disposed in a cross area between a pair of adjacent impurity doped regions 2 and gate line 10 has one impurity doped region as its source region and the other impurity doped region as its drain region. The gate line 10 is made of tungsten silicide (WSi) or tungsten (W) to electrically connect each FET 20 and corresponding side wall spacers 7, while electrically connecting the gate electrodes 5 of a plurality of FET's 20 disposed in line along the X-axis direction. In each cross area of the gate line 10 and impurity doped region 2, they are electrically insulated from each other by the insulating film 3.

Figure 3:
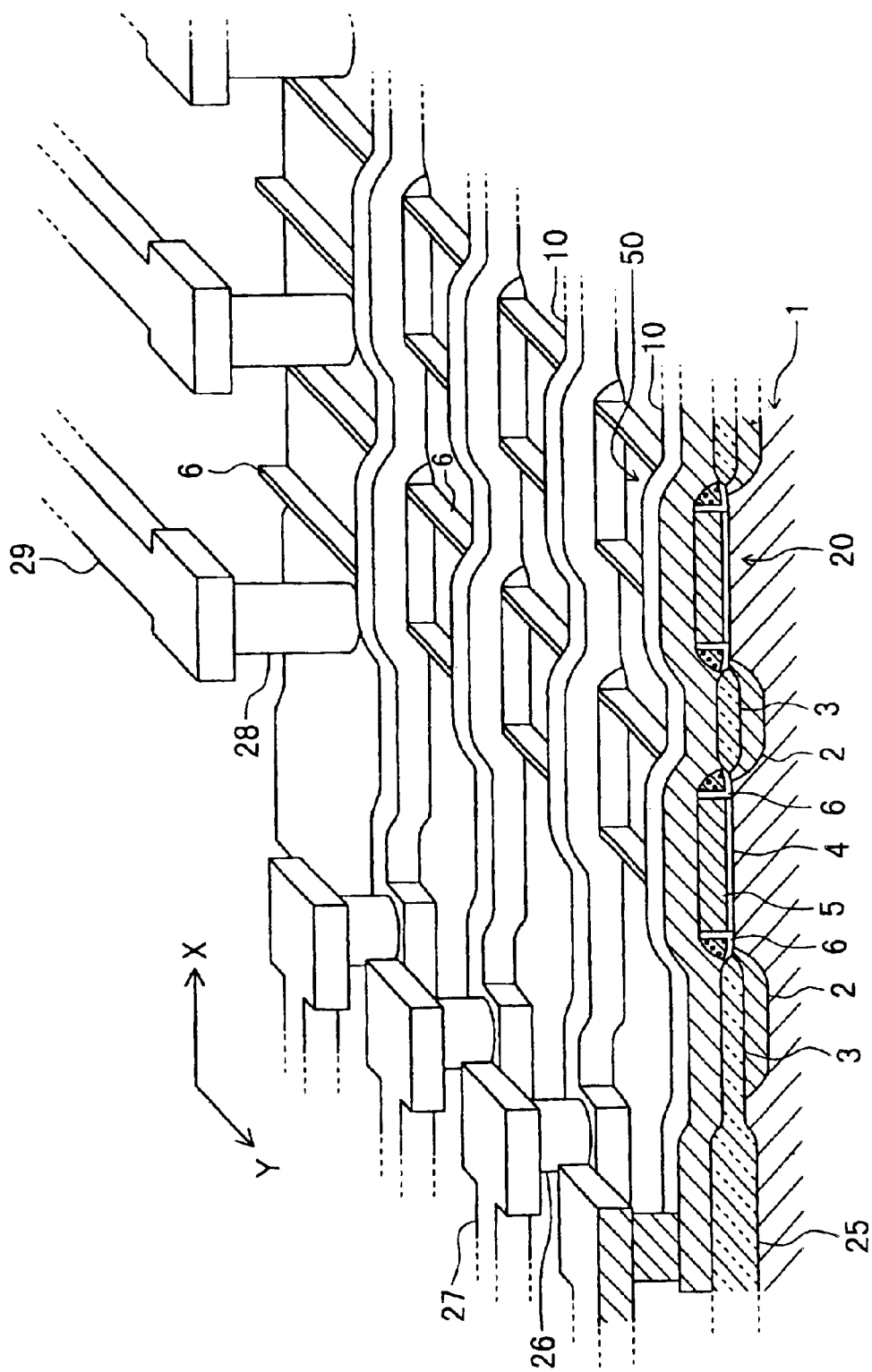
FIG. 3 is a partially broken perspective view of the semiconductor device of the first embodiment.

FIG. 3 is a partially broken perspective view of the semiconductor device shown in FIGS. 1 and 2. A filed oxide film 25 is formed on the surface of the silicon substrate 1 to define an active region. The impurity doped regions 2 and FET's 20 are formed in this active region. In the area between adjacent gate lines 10, the gate electrodes 5 and side wall spacers 7 are removed. The ONO film 6 is left also in the area between adjacent gate lines 10.

The end of the gate line 10 extends on the surface of the field oxide film 25. The end portion of each gate line 10 is connected to an overlaid wiring line 27 via a plug 26 in a via hole formed through an interlevel insulating film covering the gate line 10. Each impurity doped region 2 is connected to an overlaid wiring line 29 via a plug 28 in a via hole formed through an interlevel insulating film.

Figure 4:
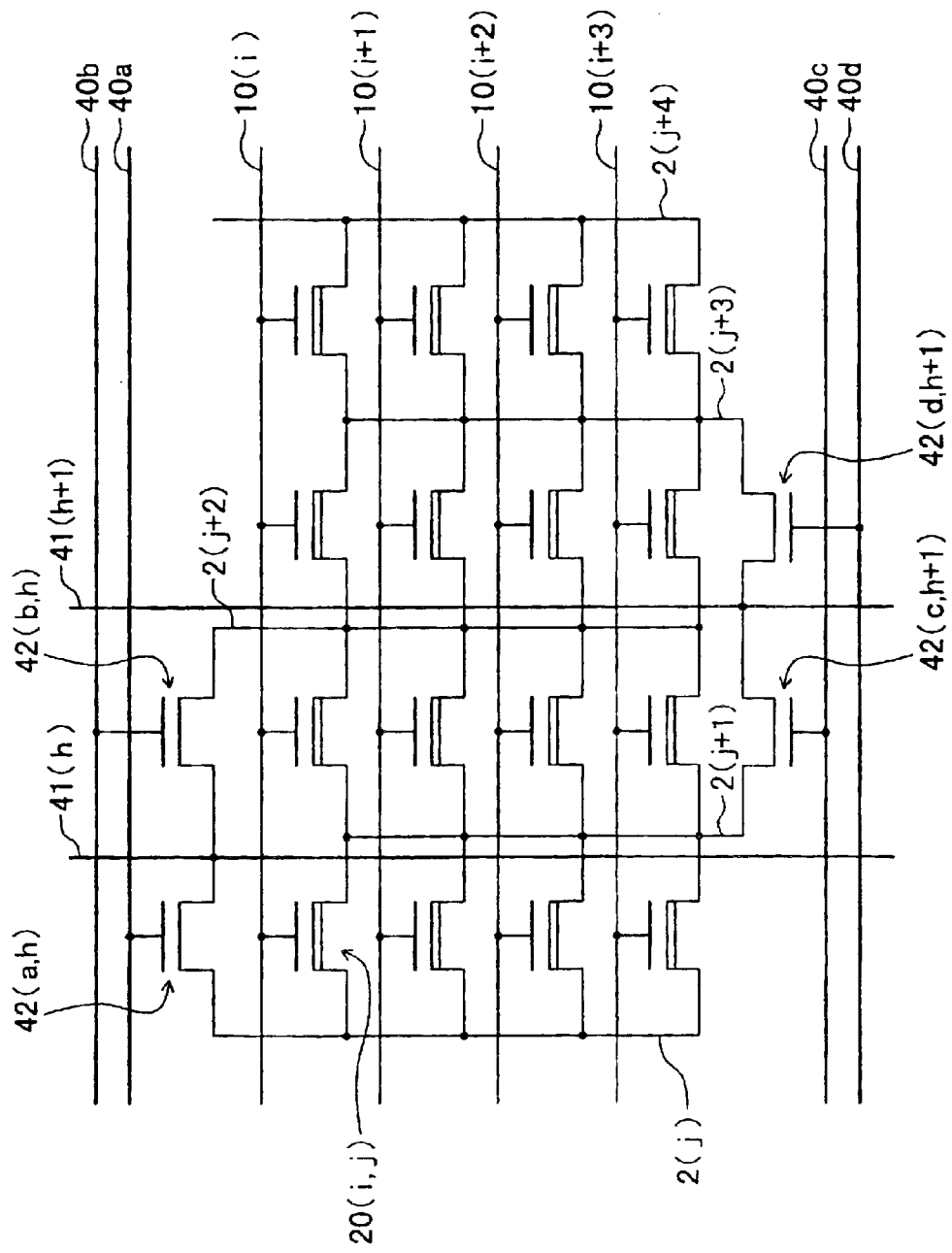
FIG. 4 is an equivalent circuit of the semiconductor device of the first embodiment.

FIG. 4 is an equivalent circuit of the semiconductor device of the first embodiment. Word lines 10 (i), bit lines 2 (j) and FET 20 (i, j) correspond to the gate lines 10, impurity doped regions 2 and FET's 20 shown in FIGS. 1 to 3, respectively. A plurality of main lines 41 (h) are disposed in parallel to the direction along which the bit lines 2 (j) extend.

The gate electrode of FET 20 (i, j) at i-th row and j-th column is connected to the word line 10 (i), the source region thereof is connected to the bit line 2(j) and the drain region is connected to the bit line 2 (j+1). The bit line 2 (j) is connected to a main line 41 (h) via FET 42 (a, h), and the bit line 2 (j+1) is connected to a main line 41 (h+1) via FET 42 (c, h+1). The bit line 2 (j+2) is connected to the main line 41 (h) via FET 42 (b, h), and the bit line 2 (j+3) is connected to the main line 41 (h+1) via FET 42 (d, h+1).

The gate electrodes of FET 42 (a, h), FET 42 (b, h), FET 42 (c, h+1) and FET 42 (d, h+1) are connected to gate select lines 40a, 40b, 40c, and 40d, respectively. By selecting one of the gate select lines 40a and 40b, one of the gate select gate lines 40c and 40d and one word line 10 (i), one FET can be selected from a plurality of FET's 20 (i, j) disposed in a matrix form.

For example, if the gate select lines 40a and 40c and the word line 10 (i) are selected, FET 42 (a, h) can be selected. In this case, voltage applied to the main line 41 (h) is applied to the source region of FET 20 (i, j) via FET 42 (a, h). Voltage applied to the main line 41 (h+1) is applied to the drain region of FET 20 (i, j) via FET 42 (c, h+1). It is assumed that of the source and drain regions of FET 20 (i, j), the region connected to the bit line 2 (j) having a smaller number (j) is called the source region and the region connected to the bit line 2 (j+1) having a larger number (j+1) is called the drain region.

Next, with reference to FIGS. 5A to 5H, a method of manufacturing the semiconductor device of the first embodiment will be described.

On the surface of a p-type silicon substrate 1 shown in FIG. 5A, a field oxide film 25 shown in FIG. 3 is formed by LOCOS. A temperature of thermal oxidation is 900 to 1100° C. and a thickness of the field oxide film 25 is 200 to 500 nm. In FIGS. 5A to 5H, the field oxide film 25 is not shown because it is formed in the area outside of these cross sectional views.

The surface of the silicon substrate 1 is oxidized at a temperature of 800 to 1100° C. to form a gate insulating film 4 having a thickness of 5 to 10 nm in the active region. The gate insulating film 4 formed by this process is used also as the gate insulating film of a transistor in the peripheral circuit area other than the memory cell area.

On the surface of the gate insulating film 4, an amorphous silicon film of 50 to 100 nm in thickness is formed and patterned to leave gate electrodes 5. The gate electrode 5 is doped with phosphorous (P) to give n-type conductivity. In this state, the gate electrode 5 is left also in the area between a plurality of gate lines 10 shown in FIG. 3 and extends along the Y-axis direction.

The amorphous silicon film is grown by chemical vapor deposition (CVD) and during this growth, phosphorous (P) is doped to a concentration of $2 \times 10^{20}$ to $3 \times 10^{21}$ cm$^{-3}$. Etching the amorphous silicon film can be performed by reactive ion etching (RIE) using mixed gas of HCl and O$_2$. During this etching, the peripheral circuit area is covered with a resist pattern to leave the amorphous silicon film.

As shown in FIG. 5B, the gate insulating film 4 not covered with the gate electrode 5 is removed by using hydrofluoric acid. The surface of the silicon substrate 1 is therefore exposed between a pair of adjacent gate electrodes 5.

As shown in FIG. 5C, over the whole substrate surface, a silicon oxide film 6A, a silicon nitride film 6B and a silicon oxide film 6C are sequentially deposited. These three films constitute an ONO film 6. The silicon oxide film 6A is formed through thermal oxidation by heating the substrate surface at a temperature of 800 to 1100° C. A thickness of the silicon oxide film 6A is 5 to 10 nm.

The silicon nitride film 6B is formed by CVD at a growth temperature of 600 to 800° C. The silicon oxide film 6C is formed through wet oxidation of the surface layer of the silicon nitride film at a temperature of 1000 to 1100° C. A thickness of the silicon nitride film immediately after the growth is 12 to 16 nm. A thickness of the silicon oxide film 6C formed by oxidizing the silicon nitride film is 5 to 10 nm. The silicon nitride film may be grown thin by CVD, and the silicon oxide film 6C is formed thereon by CVD.

Processes up to the state shown in FIG. 5D will be described. A non-doped polysilicon film is grown by CVD to a thickness of 50 to 100 nm, covering the substrate surface. This polysilicon film is anisotropically etched to leave side wall spacers 7 on the surface of the ONO film 6 in an area corresponding to the side walls of the gate electrode 5. Etching the polysilicon film can be performed by RIE using mixed gas of HCl and O$_2$.

As shown in FIG. 5E, the silicon oxide film 6C is etched and the exposed silicon nitride film 6B are etched until the silicon oxide film 6A is exposed on the upper surface of the gate electrode 5 and the surface of the silicon substrate 1. Etching the silicon oxide film 6C and silicon nitride film 6B can be performed through RIE using mixed gas of CF$_4$, CHF$_3$ and O$_2$. Under these etching conditions, since the etching rate of the silicon nitride film is sufficiently faster than that of the silicon oxide film, the lowermost silicon oxide film 6A can be left with good reproductivity. The width of each ONO film 6 covering the substrate surfaces on both sides of the gate electrode 5 is determined by the thickness of the side wall spacer 7.

As shown in FIG. 5F, by using the gate electrode 5 and side wall spacers 7 as a mask, arsenic (As) ions are implanted into the surface layer of the silicon substrate 1. This ion implantation is performed under the conditions of an acceleration energy of 50 to 90 keV and a dose of $2 \times 10^{15}$ to $5 \times 10^{15}$ cm$^{-2}$. Impurity doped regions 2 are therefore formed. In this case, arsenic ions are implanted also into the top region of the side wall spacer 7 and the surface layer of the gate electrode 5. Arsenic ions are not implanted in the peripheral transistor area because this area is covered with the polysilicon film formed at the same time when the gate electrode 5 was formed.

As shown in FIG. 5G, the surface of the silicon substrate 1 is locally wet-oxidized at a temperature of 800 to 1000° C. An insulating film 3 having a thickness of 40 to 60 nm and made of silicon oxide is therefore formed on the surface of the impurity doped region 2. A silicon oxide film 7a is also formed on the surface of the side wall spacer 7. The silicon oxide film 6A left on the upper surface of the gate electrode 5 becomes thicker. An oxidation speed of the region where arsenic ions were implanted is four to eight times faster than that of the region where arsenic ions were not implanted.

During wet oxidation, arsenic atoms in the impurity doped region 2 diffuses laterally so that the impurity doped region 2 invades under the silicon nitride film 6B. A bird's beak is formed on the boundary of the insulating film 3, the bird's beak being disposed under the silicon nitride film 6B. The front end of the bird's beak does not reach the boundary of the impurity doped region 2.

As shown in FIG. 5H, the silicon oxide film formed on the upper surface of the gate electrode 5 and on the surface of the side wall spacer 7 is removed by hydrofluoric acid.

Processes up to the state shown in FIG. 2 will be described. A conductive film of WSi or W is formed on the whole substrate surface to a thickness of 100 to 150 nm by CVD. On the surface of this conductive film, a resist pattern corresponding to the gate lines shown in FIG. 1 is formed. The conductive film, gate electrodes 5 and side wall spacers 7 respectively not covered with the resist pattern are etched. This etching can be performed by RIE using mixed gas of HCl and $O_2$. This etching process patterns the gate electrodes of peripheral transistors at the same time. After the etching, the resist pattern is removed.

As shown in FIG. 3, the gate insulating film 4 and insulating film 3 are therefore exposed in the area between two adjacent gate lines 10. By using the gate line 10 as a mask, boron (B) ions are implanted into the surface layer of the substrate under the gate insulating film 4 under the conditions of an acceleration energy of 50 to 80 keV and a dose of $3 \times 10^{12}$ to $1 \times 10^{13}$ cm$^{-2}$. A channel stopper region 50 doped with boron is therefore formed between the channel regions of two FET's 20 juxtaposed in the Y-axis direction.

Figure 11A:
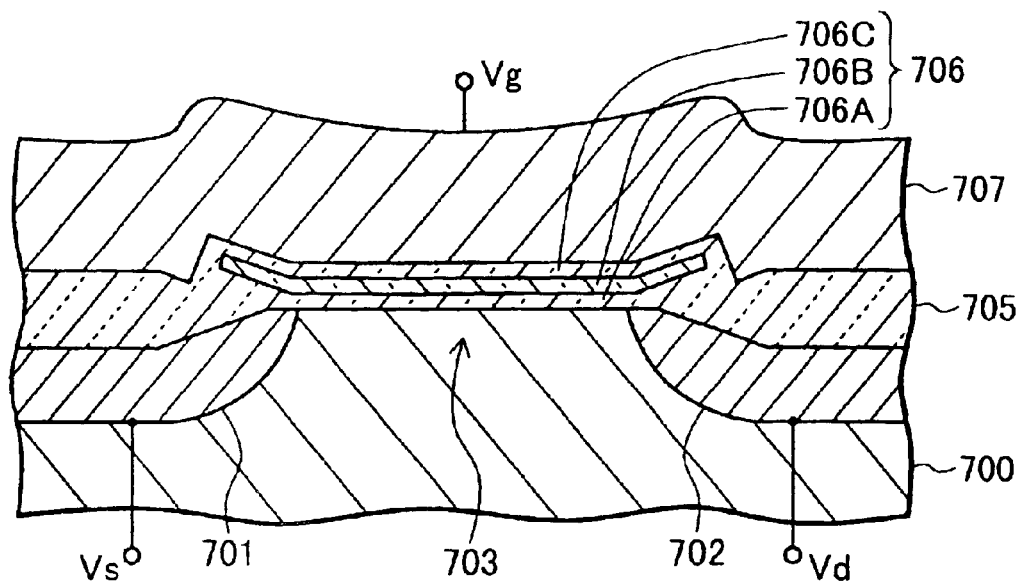
FIGS. 11A to 11C are cross sectional views of conventional flash memory cells.

The operation principle of the semiconductor device of the first embodiment shown in FIG. 2 is similar to that of the conventional semiconductor device shown in FIG. 11A. The advantages of the semiconductor device of the first embodiment will be described through comparison with the conventional semiconductor devices shown in FIGS. 11A to 11C.

In the conventional semiconductor device shown in FIG. 11A, the distribution of CHE injected electrons has a peak toward the center of the channel region 703 more than that of holes injected by inter-band tunneling. Because of occurrence of secondary collision ionized hot electron injection, electrons are trapped in some cases in the silicon nitride film 706B in an area near the center of the channel region 703.

In contrast with this, in the first embodiment shown in FIG. 2, the silicon nitride film 6B is not disposed in an area near the center of the channel region, but the silicon nitride film 6B is disposed only in an area near the boundary between the channel region and drain region 2. Therefore, the distribution of CHE injected electrons is approximately superposed upon the distribution of holes injected by interband tunneling. It is therefore possible during the data erase to neutralize charges of electrons trapped in the silicon nitride film 6B with ease by injecting holes. Further, even if secondary collision ionized hot electrons are generated, electrons are not trapped in the area near the center of the channel region.

Write/erase threshold voltages can be prevented from being raised even if the write/erase operations are repeated, because electrons are not accumulated in the silicon nitride film 6B.

Figure 11B:
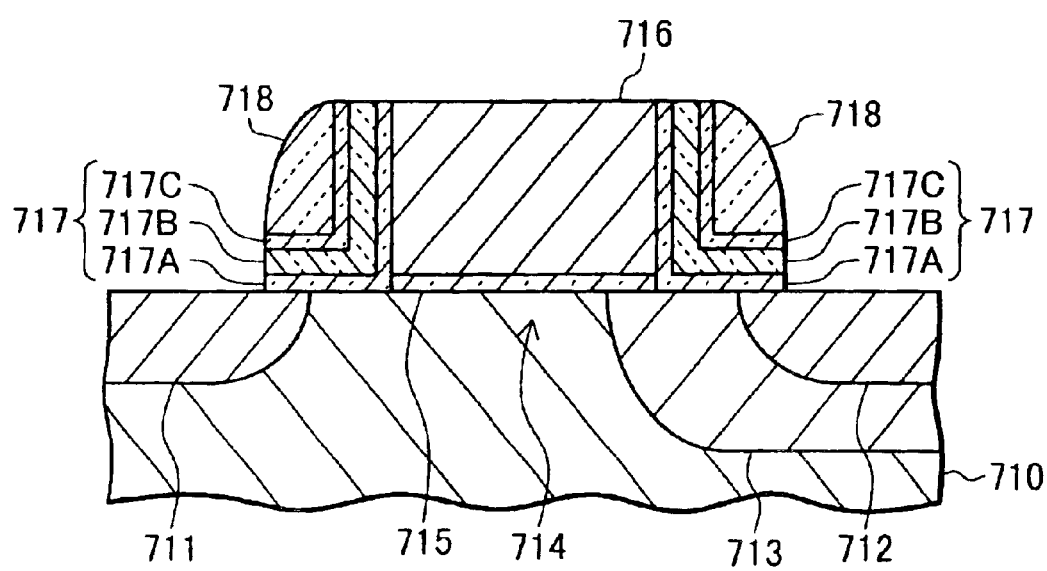

In the semiconductor device shown in FIG. 11B, the drain side has the LDD structure so that one data of one bit can be stored in one memory cell. In contrast with this, in the first embodiment shown in FIG. 2, data of two bits can be stored by independently accumulating electrons in the silicon nitride film 6B of the ONO film 6 in the regions on right and left sides of FET 20.

Figure 11C:
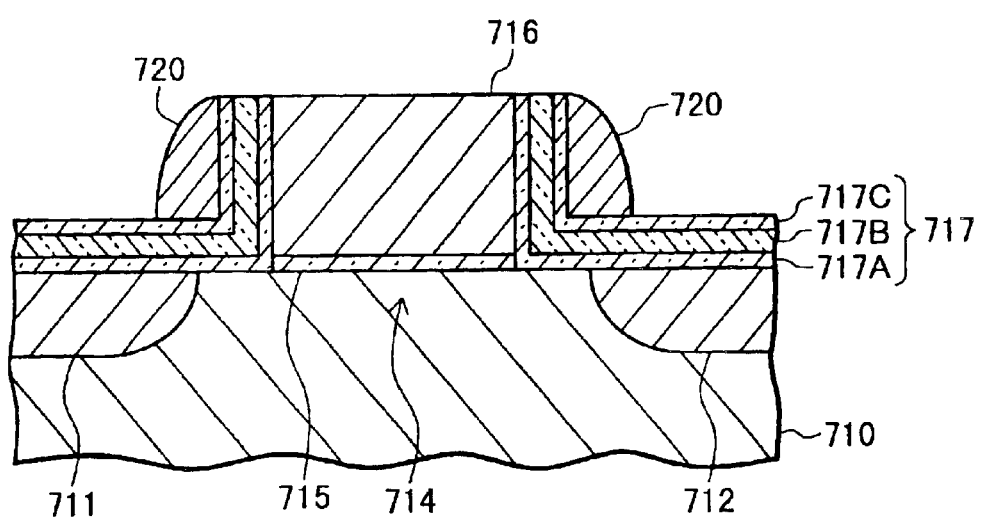

In the semiconductor device shown in FIG. 11C, a gate voltage is applied to the channel region under the ONO film 717 via a serial connection of the capacitor constituted of the gate electrode 716 and side wall spacer 720 and the capacitor constituted of the side wall spacer 720 and channel region 714. A relatively high gate voltage is therefore necessary for data write/erase.

In contrast with this, in the first embodiment shown in FIG. 2, the gate electrode 5 is connected to the side wall spacers 7 via the gate line 10. The gate voltage is therefore applied directly to the side wall spacers 7 so that the gate voltage for the write/erase can be lowered.

Next, a second embodiment of the invention will be described with reference to FIGS. 6A to 6L. The layout of the semiconductor device of the second embodiment as viewed in plan of the substrate is similar to that of the first embodiment shown in FIG. 1. FIGS. 6A to 6H correspond to the cross sectional views taken along one-dot chain line A2—A2 shown in FIG. 1, and FIGS. 6I to 6L correspond to the cross sectional views taken along one-dot chain line A13—A13 shown in FIG. 1. A method of manufacturing a semiconductor device according to the second embodiment will be described.

Processes up to the state shown in FIG. 6A will be described. An active region is defined by an element isolation insulating film of 100 to 300 nm in thickness formed in the surface layer of a p-type silicon substrate 101. This element isolation insulating film has, for example, a shallow trench isolation (STI) structure.

The substrate surface is thermally oxidized at a temperature of 800 to 1100° C. to form a silicon oxide film of 5 to 10 nm in thickness in the active region. On this silicon oxide film, an amorphous silicon film of 50 to 100 nm in thickness is formed by CVD. During the growth of this amorphous silicon film, phosphorous is doped to a concentration of $2 \times 10^{20}$ to $3 \times 10^{21}$ cm$^{-3}$. A silicon nitride film is grown by CVD on the amorphous silicon film to a thickness of 80 to 120 nm.

The silicon oxide film, amorphous silicon film and silicon nitride film are patterned to leave a plurality of lamination structures each having a gate insulating film 104 made of silicon oxide, a gate electrode 105 made of amorphous silicon and a gate upper film 106 made of silicon nitride stacked in this order. Each lamination structure extends in the Y-axis direction shown in FIG. 1. Etching the silicon nitride film is performed by RIE using mixed gas of $CF_4$, $CHF_3$ and $O_2$. Etching the amorphous silicon film is performed by RIE using mixed gas of HCl and $O_2$. Etching the silicon oxide film is performed by wet etching with hydrofluoric acid, by using the gate electrode 105 as a mask after the resist pattern is removed. The peripheral transistor area other than the memory cell area is covered with the amorphous silicon film and silicon nitride film.

As shown in FIG. 6B, an ONO film 110 is formed over the whole substrate surface. A lowermost silicon oxide film 110A is formed through thermal oxidation at a temperature of 800 to 1100° C. Since the surface of the gate upper film 106 made of silicon nitride film is hardly oxidized, the silicon oxide film 110A is formed mainly on the exposed surfaces of the gate electrode 105 and silicon substrate 101.

A middle silicon nitride film 110B is formed by CVD at a growth temperature of 600 to 800° C. An uppermost silicon oxide film 110C is formed through wet oxidation of the surface layer of the silicon nitride film at a temperature of 1000 to 1100° C. A thickness of the silicon nitride film before wet oxidation is 12 to 16 nm and a thickness of the silicon oxide film 110C is 5 to 10 nm.

As shown in FIG. 6C, on the surface of the ONO film 110, a non-doped polysilicon film 111 is deposited to a thickness of 50 to 100 nm by CVD.

Processes up to the state shown in FIG. 6D will be described. The polysilicon film 111 is anisotropically etched to leave side wall spacers 111a on the surface of the ONO film 110 in an area corresponding to the side walls of the gate electrode 105 and gate upper film 106. The upper silicon oxide film 110C and middle silicon nitride film 110B are removed by RIE using mixed gas of $CH_4$, $CHF_3$ and $O_2$. The ONO film 110 having the three-layer structure is left on the side walls of the gate electrode 105 and gate upper film 106.

Figure 6E:
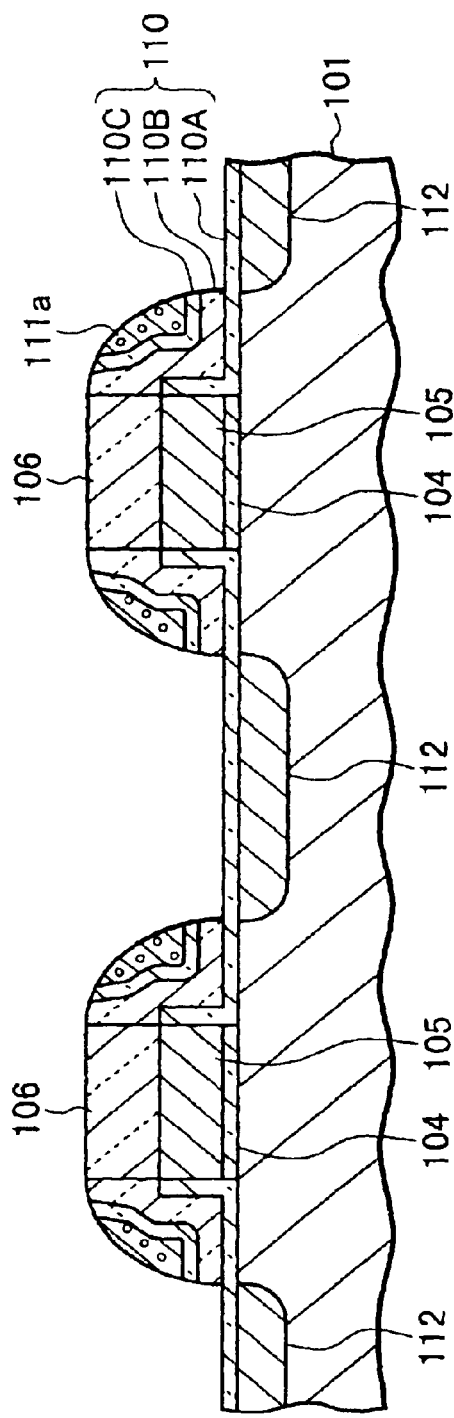

As shown in FIG. 6E, arsenic (As) ions are implanted into the surface layer of the silicon substrate 101 by using as a mask the gate electrode 105, gate upper film 106, side wall spacers 111a and ONO film 110. The ion implantation conditions are an acceleration energy of 50 to 90 keV and a dose of $2\times10^{15}$ to $5\times10^{15}$ $cm^{-2}$. This ion implantation forms n-type impurity doped regions 112. This impurity doped region 112 corresponds to the impurity doped region 2 shown in FIG. 1. Arsenic (As) ions are not implanted into the surface layer of the substrate in the peripheral transistor area because this area is covered with the amorphous silicon film and silicon nitride film.

Figure 6F:
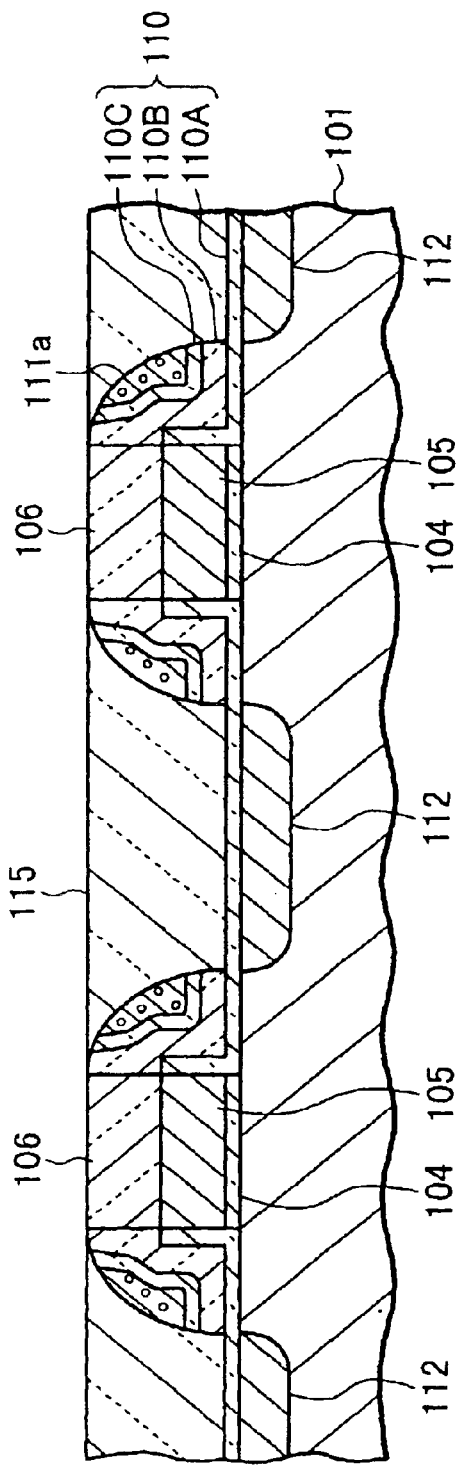

Processes up to the state shown in FIG. 6F will be described. An insulating film having a thickness of 500 to 1000 nm is formed on the whole substrate surface by CVD using tetraethylorthosilicate (TEOS). This insulating film is subjected to chemical mechanical polishing until the surface of the gate upper film 106 is exposed. In this case, the gate upper film 106 functions as a stopper film of chemical mechanical polishing.

Figure 6G:
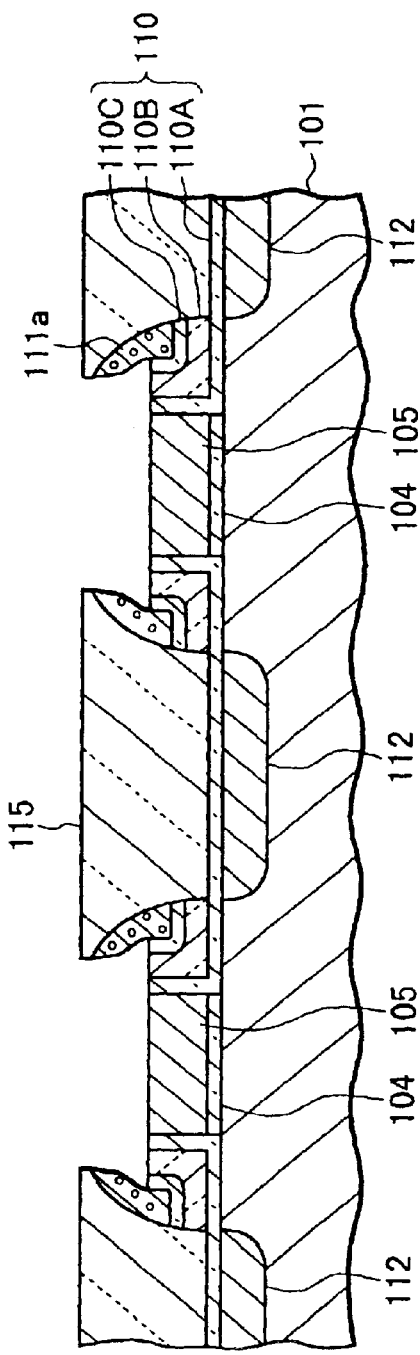

As shown in FIG. 6G, the gate upper film 106 and part of the ONO film 110 are etched to expose the upper surface of the gate electrode 105 and the inner walls of the side wall spacers 111a protruding higher than the upper surface of the gate electrode 105. Etching the gate upper film 106 made of silicon nitride and the silicon nitride film 110B is performed by wet processing using hot phosphoric acid. Etching the silicon oxide film 110C on the inner surface of the side wall spacer 111a is performed by a wet process using hydrofluoric acid.

Figure 6H:
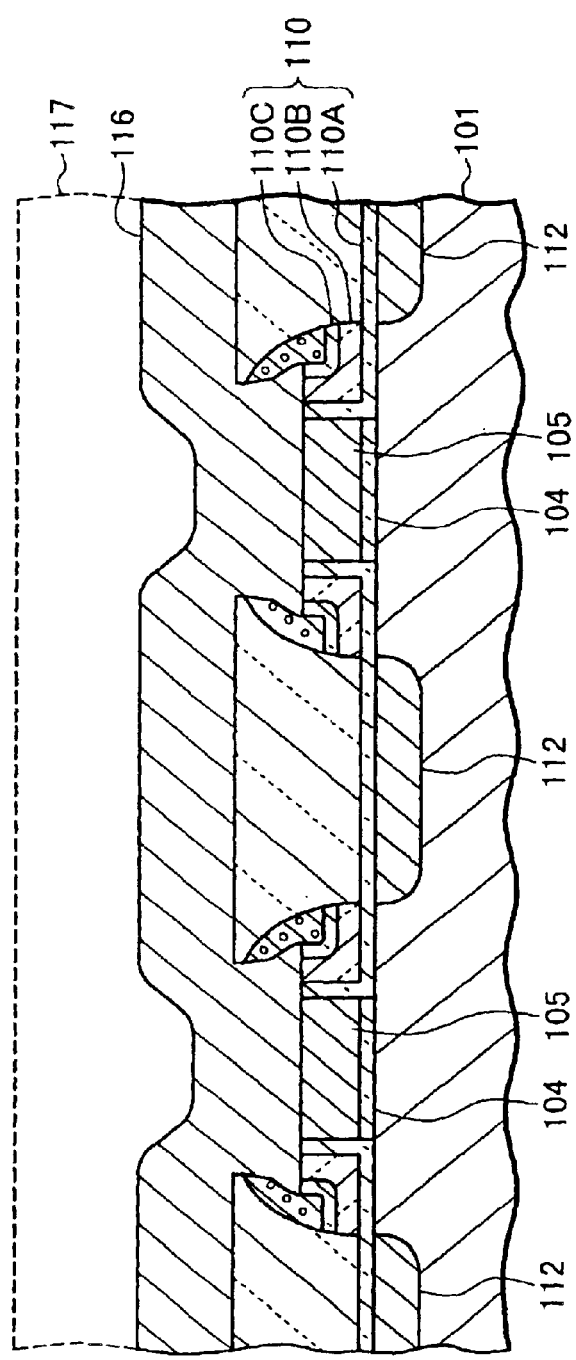

As shown in FIG. 6H, a conductive film of WSi or W is deposited to a thickness of 100 to 150 nm by CVD. This conductive film is patterned by using a resist pattern 117 to leave gate lines 116. The gate line 116 corresponds to the gate line 10 shown in FIG. 1. The gate line 116 is in contact with the upper surface of the gate electrode 105 and the inner walls of the projected regions of the side wall spacers 111a so that the gate electrode 105 is electrically connected to the side wall spacers 111a. The interlevel insulating film 115 electrically insulates the gate line 116 from the impurity doped regions 112. In the peripheral transistor area, gate electrodes having the two-layer structure of the amorphous silicon film and the conductive film of WSi or W are formed.

Figure 6I:
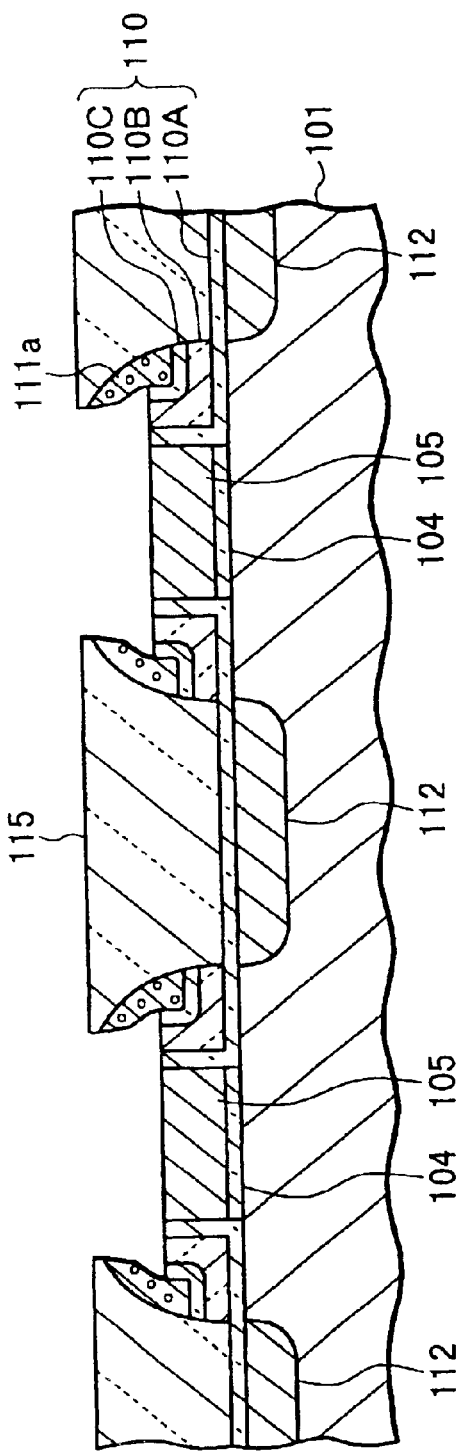

FIG. 6I is a cross sectional view showing the region where the gate line 116 is not left (corresponding to the cross sectional view taken along one-dot chain line A13—A13 shown in FIG. 1). The resist pattern 117 is left on the gate line 116.

Figure 6J:
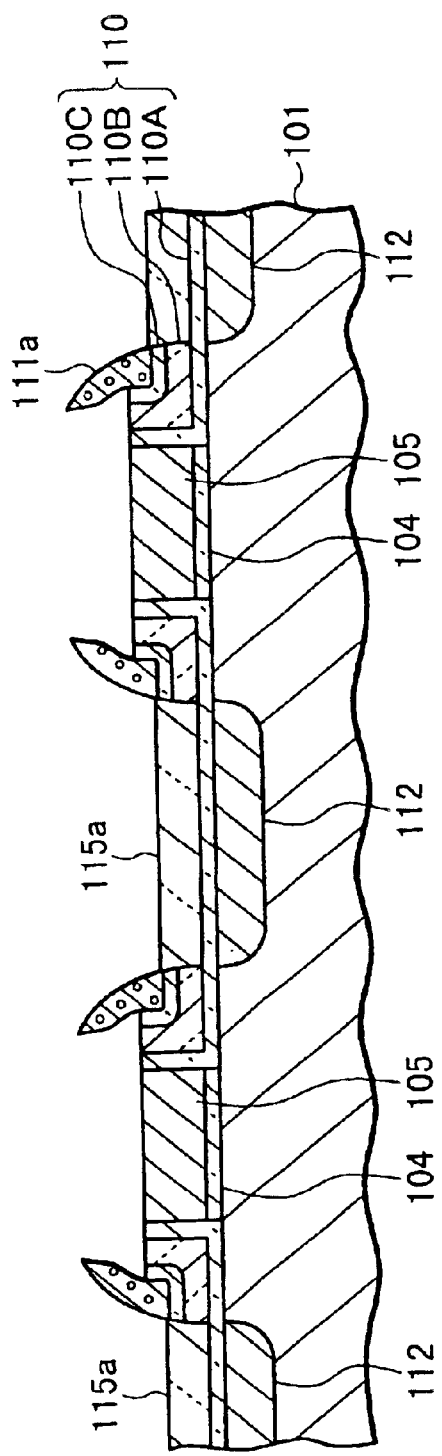

As shown in FIG. 6J, the interlevel insulating film 115 is etched from the upper surface thereof to some depth. The thickness of a left interlevel insulating film 115a is 30 to 50 nm. This interlevel insulating film 115a is used as a protective film for preventing a metal silicide film from being formed on the surface of the impurity doped region 112 when the metal suicide film is formed on the surfaces of the source and drain regions of peripheral transistors.

As shown in FIG. 6K, the gate electrode 105 and side wall spacers 111a are etched by RIE using mixed gas of HCl and $O_2$. During this process, the resist pattern 117 shown in FIG. 6H protects the gate line 116. After the gate electrode 105 and side wall spacers 111a are etched, the resist pattern 117 is removed.

As shown in FIG. 6L, boron ions are implanted to form a p-type channel stopper region 118 in the surface layer of the silicon substrate 101. This ion implantation is performed under the conditions of an acceleration energy of 50 to 80 keV and a dose of $3\times10^{12}$ to $1\times10^{13}$ $cm^{-2}$. Boron ions are not implanted into the surface layer of the substrate under the gate line 116 shown in FIG. 6H.

The dose of arsenic (As) in the impurity doped region 112 is $2\times10^{15}$ to $5\times10^{15}$ $cm^{-2}$ which is about 100 times the dose of boron. Therefore, the impurity doped region 112 is hardly influenced by boron ion implantation.

Also in the second embodiment, similar to the first embodiment, the silicon nitride film is not disposed in the area near the center of the channel region of each FET constituting the memory cell, as shown in FIG. 6H. Therefore, advantages similar to the first embodiment can be obtained. In the second embodiment, a bird's beak is not disposed under the ONO film 110 so that the write/erase performance can be expected to be improved.

Next, a third embodiment of the invention will be described with reference to FIGS. 7A to 7F. The layout of the semiconductor device of the third embodiment as viewed in plan of the substrate is similar to that of the first embodiment shown in FIG. 1. FIGS. 7A to 7E correspond to the cross sectional views showing one FET and taken along one-dot chain line A2—A2 shown in FIG. 1, and FIG. 7F corresponds to the cross sectional view showing one channel stopper region and taken along one-dot chain line A13—A13 shown in FIG. 1. A method of manufacturing a semiconductor device according to the third embodiment will be described.

Processes up to the state shown in FIG. 7A will be described. An active region is defined by a field oxide film formed in the surface layer of a p-type silicon substrate 201. An ONO film is formed on the surface of the active region. The processes of forming the ONO film are similar to those of forming the ONO film 6 of the first embodiment shown in FIG. 5C.

On the surface of the ONO film, a plurality of resist patterns 210 extending along the direction perpendicular to the drawing sheet (corresponding to the Y-axis direction shown in FIG. 1) are formed. A pair of resist patterns 210 is disposed between two adjacent impurity doped regions 2 shown in FIG. 1. The distance between a pair of resist patterns 210 is set to a shortest patterning width of photolithography processes. By using the resist patterns 210 as a mask, an uppermost silicon oxide film and a middle silicon nitride film of the ONO film are etched. Under the resist pattern 210, an ONO film 202 is left which is a lamination structure of a silicon oxide film 202A, a silicon nitride film 202B and a silicon oxide film 202C. On the surface of the silicon substrate 201 where the resist pattern 210 is not disposed, only the silicon oxide film 202A is left.

Arsenic (As) ions are implanted obliquely relative to the surface of the silicon substrate 201. In this case, the ion beam is slanted so that arsenic (As) ions are not implanted in the surface region of the substrate between the two resist patterns 210, the region being shaded by one of the resist patterns 210. In the surface region of the substrate exposed to ion beams, impurity doped regions 203 implanted with arsenic ions are formed.

Figure 7A:
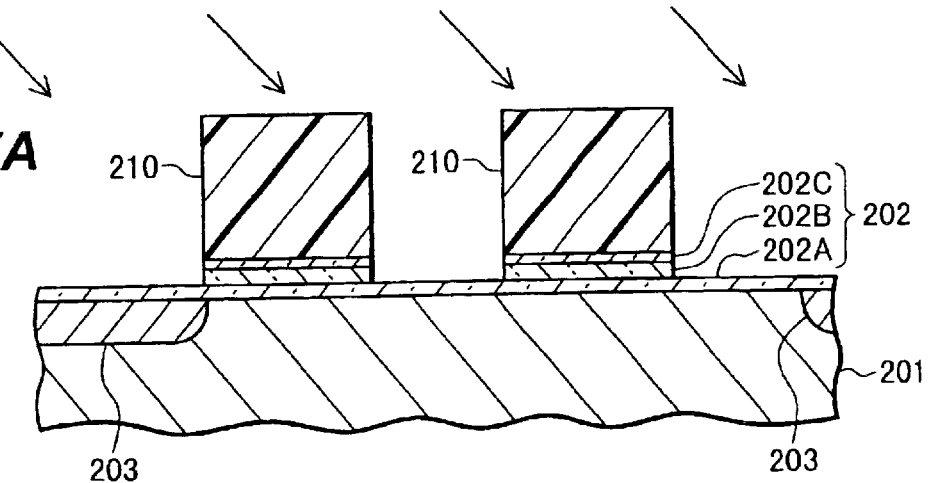
FIGS. 7A to 7F are cross sectional views of a substrate illustrating a method of manufacturing a semiconductor device according to a third embodiment.
Figure 7B:
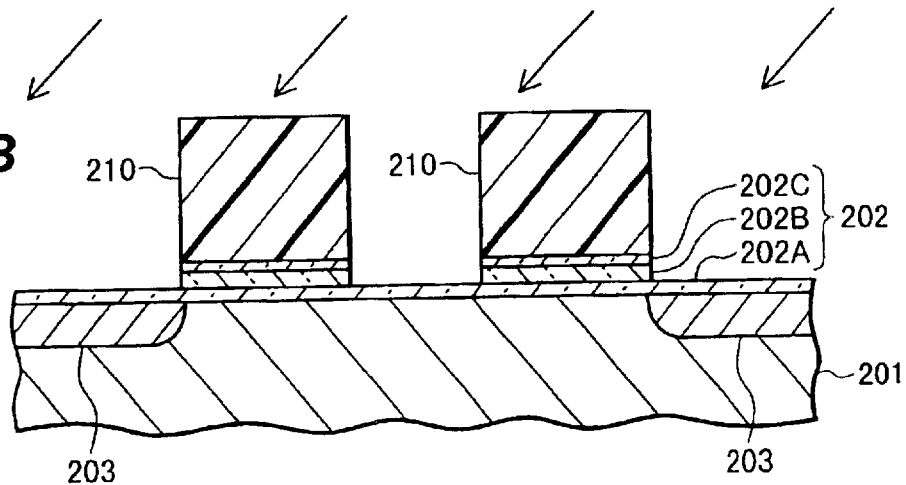

As shown in FIG. 7B, the axis of the ion beam is slanted to the opposite side to the axis of the ion beam used in the process shown in FIG. 7A and arsenic (As) ions are again implanted. The ion implantation conditions of these two processes are an acceleration energy of 50 to 90 keV and a dose of $1 \times 10^{15}$ to $2.5 \times 10^{15}$ cm$^{-2}$. In the substrate surface layer outside of the pair of resist patterns 210, impurity doped regions 203 implanted with arsenic (As) are therefore formed. The boundary of each of the impurity doped regions 203 is coincide with the boundary of the corresponding resist pattern 210, or extends into the region under of the corresponding resist pattern 210 to some depth.

Figure 7C:
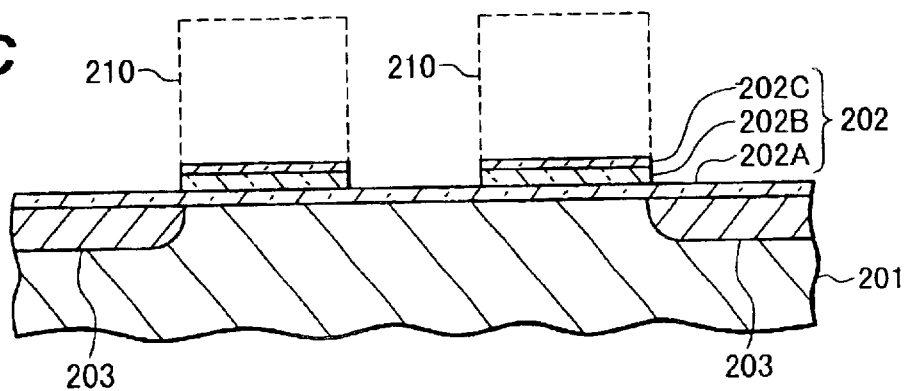

As shown in FIG. 7C, by using the resist patterns 210 as a mask, the exposed silicon oxide film 202A is etched. After the etching, the resist patterns 210 are removed. Thereafter, the memory cell area is covered with a resist pattern and the ONO film 202 in the peripheral transistor area is removed. After the ONO film is removed, the resist pattern is removed.

Figure 7D:
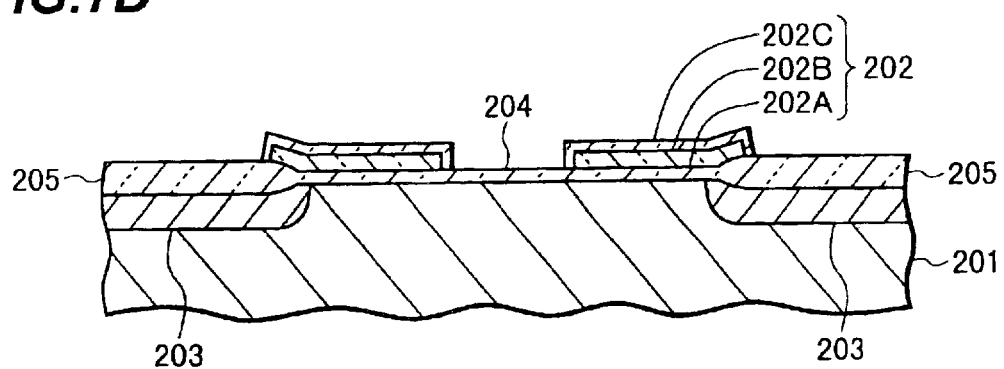

Processes up to the state shown in FIG. 7D will be described. The exposed surface of the silicon substrate 201 is thermally oxidized at a temperature of 800 to 1100° C. to form a gate insulating film 204 having a thickness of 5 to 10 nm. An oxidation speed of the region where arsenic (As) ions were implanted is about six to eight times that of the region where arsenic (As) ions are not implanted. Therefore, in the surface layer of the impurity doped region 203, an insulating film 205 of silicon oxide having a thickness of 40 to 60 nm is formed. A bird's beak extending under the ONO film 202 is formed at the boundary of the insulating film 205. A bird's beam is not formed at the boundary of the gate insulating film 204 because this film is thin. With the thermal oxidation, the surface of the silicon nitride film 202B is also oxidized slightly.

Processes up to the state shown in FIG. 7E will be described. An amorphous silicon film of 100 to 150 nm in thickness is formed on the whole substrate surface by CVD, and on this amorphous silicon film, a WSi film of 100 to 150 nm in thickness is formed by CVD. During the growth of the amorphous silicon film, phosphorous is doped to a concentration of $2 \times 10^{20}$ to $3 \times 10^{21}$ cm$^{-3}$.

Two layers of the amorphous silicon film and WSi film are patterned to leave gate lines 206. The gate line 206 corresponds to the gate line 10 shown in FIG. 1. Etching the two layers is performed by RIE using mixed gas of HCl and O$_2$. The gate line 206 functions also as the gate electrode of each FET, a pair of impurity doped regions 203 becomes the source and drain regions, and the silicon oxide film 202A becomes the gate insulating film.

In each FET, if the upper surface is divided into a first area on the source region side, a second area on the drain region side, and a third area between the first and second areas, then the silicon nitride film 202B is disposed on the first and third areas. This silicon nitride film 202B is covered with the silicon oxide film 202C and traps electrons.

Figure 7E:
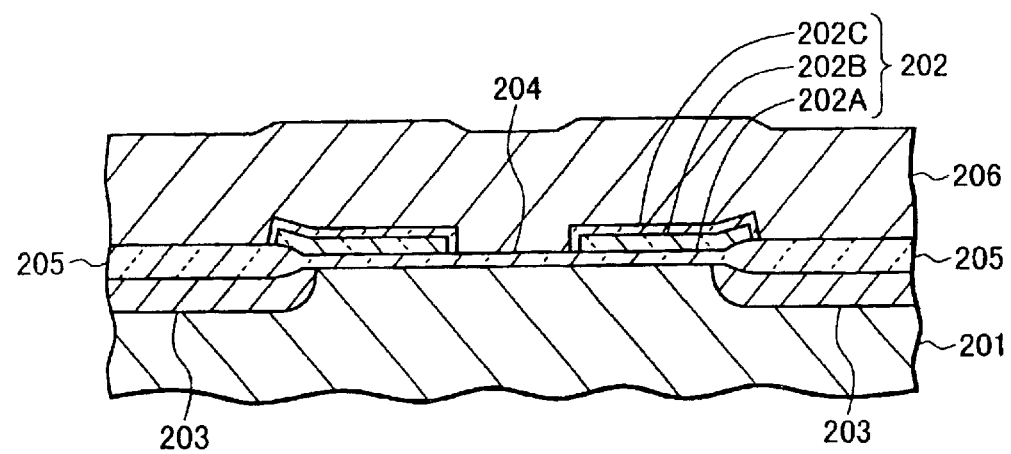
Figure 7F:
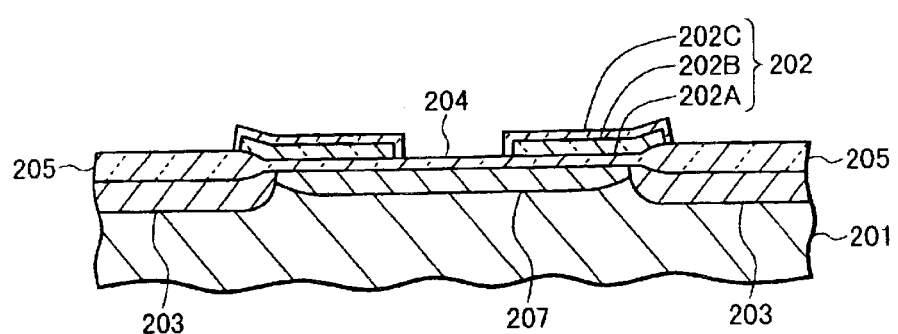

FIG. 7F is a cross sectional view showing the region between two adjacent gate lines 206 (corresponding to the cross sectional view taken along one-dot chain line A13— A13 shown in FIG. 1). By using the resist pattern used for leaving the gate lines 206, boron ions are implanted to form a channel stopper region 207.

Also in the third embodiment, similar to the first embodiment, the silicon nitride film is not disposed in the area near the center of the channel region of each FET constituting the memory cell, as shown in FIG. 7E. Therefore, advantages similar to the first embodiment can be obtained.

Figure 8A:
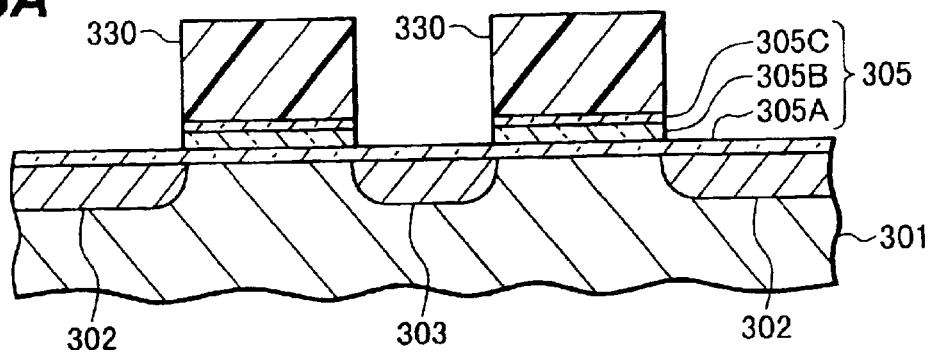
FIGS. 8A to 8D are cross sectional views of a substrate illustrating a method of manufacturing a semiconductor device according to a fourth embodiment.
Figure 8B:
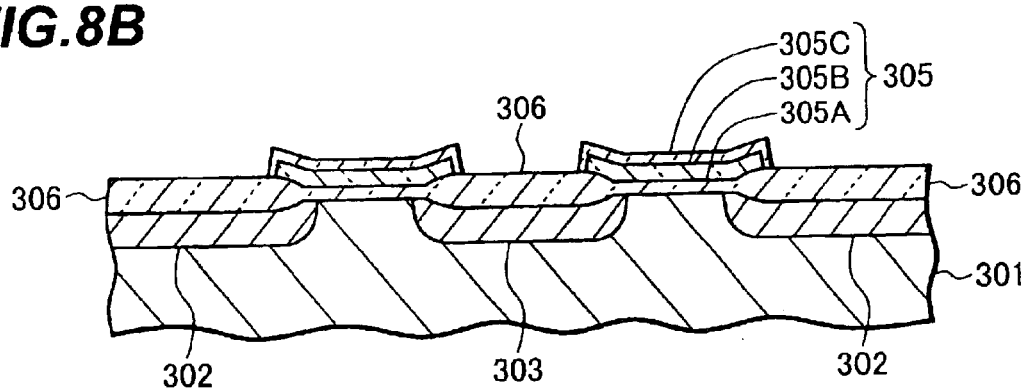
Figure 8C:
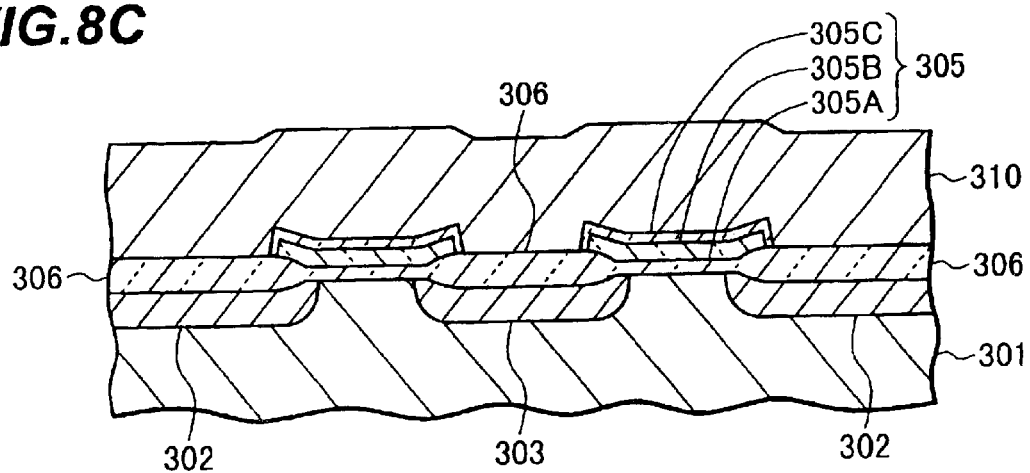

Next, a fourth embodiment of the invention will be described with reference to FIGS. 8A to 8D. The layout of the semiconductor device of the fourth embodiment as viewed in plan of the substrate is similar to that of the first embodiment shown in FIG. 1. FIGS. 8A to 8C correspond to the cross sectional views showing one FET and taken along one-dot chain line A2—A2 shown in FIG. 1, and FIG. 8D corresponds to the cross sectional view showing one channel stopper region and taken along one-dot chain line A13— A13 shown in FIG. 1.

Processes up to the state shown in FIG. 8A will be described. By processes similar to those described with FIG. 7A, an ONO film 305 and resist patterns 330 are formed on the surface of a p-type silicon substrate 301. However, although the resist pattern 210 shown in FIG. 7A extends in the Y-axis direction shown in FIG. 1, the resist pattern 330 shown in FIG. 8A extends in the Y-axis direction shown in FIG. 1 and covers also the area corresponding to the channel stopper region 50. An upper silicon oxide film 305C and middle silicon nitride film 305B of the ONO film are left only under the resist pattern 330 and a lower silicon oxide film 305A covers the whole surface of the silicon substrate 301.

By using the resist pattern 330 as a mask, arsenic (As) ions are implanted into the surface layer of the silicon substrate 301. This ion implantation is performed under the conditions of an acceleration energy of 50 to 90 keV and a dose of $2 \times 10^{15}$ to $5 \times 10^{15}$ cm$^{-2}$. In the surface layer outside of a pair of resist patterns 330, impurity doped regions 302 are formed, and in the surface layer between the pair of resist patterns 330, an intermediate region 303 is formed. Although the impurity doped region 302 extends in the Y-axis direction shown in FIG. 1, the intermediate regions 303 are distributed dispersively in correspondence with respective FET's. After ion implantation, the resist patterns 330 are removed.

Processes up to the state shown in FIG. 8B will be described. The memory cell area is covered with a resist pattern and the ONO film 305 in the peripheral transistor area is removed. Thereafter, the resist pattern covering the memory cell area is removed.

The substrate surface is thermally oxidized at a temperature of 800 to 1100° C. to form a gate insulating film having a thickness of 5 to 10 nm in the peripheral transistor area where arsenic (As) ions are not implanted. In the memory cell area where arsenic (As) ions were implanted, because of a faster oxidation speed, an insulating film 306 having a thickness of 40 to 60 nm is formed in the area not covered with the ONO film 305. In this case, implanted arsenic (As) ions are diffused so that the impurity doped region 302 and intermediate region 303 broaden laterally. Although bird's beaks are formed at the opposite boundaries of the insulating film 306, the end of each bird's beak reaches only a position shallower in the lateral direction than the boundaries of the impurity doped region 302 and intermediate region 303. This thermal oxidation slightly oxidizes the side walls of the silicon nitride film 305B.

As shown in FIG. 8C, gate lines 310 are formed on the substrate. The gate line 310 corresponds to the gate line 10 shown in FIG. 1, and is formed by the processes similar to those of forming the gate lines 206 shown in FIG. 7E.

Figure 8D:
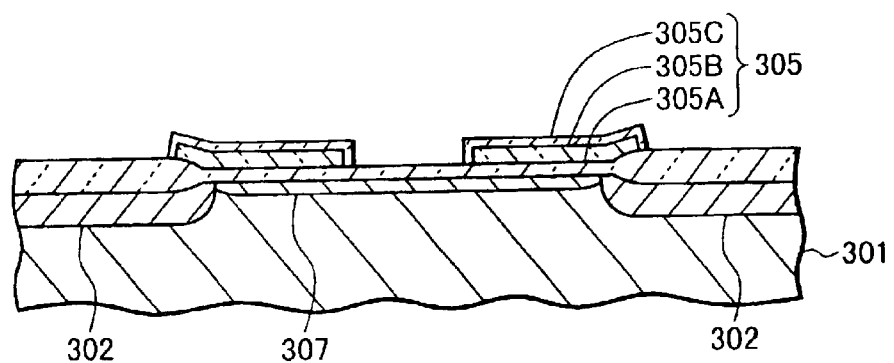

FIG. 8D is a cross sectional view showing the region between two adjacent gate lines 310 (corresponding to the cross sectional view taken along one-dot chain line A13—A13 shown in FIG. 1). By using the resist pattern used for pattering the gate lines 310, boron ions are implanted to form a channel stopper region 307.

In the fourth embodiment, the left impurity doped region 302 in FIG. 8C is used as the source region, and the right impurity doped region is used as the drain region. Next, with reference to FIG. 8C and FIGS. 9A and 9B, the operation principle of the semiconductor device of the fourth embodiment will be described.

Data is written by trapping electrons in the silicon nitride film 305B of the ONO film 305 by CHE injection. Data is erased by injecting holes in the silicon nitride film by inter-band tunneling. Data of two bits can be stored in one memory cell by trapping electrons independently in the ONO film on the source region and the ONO film on the drain region.

Figure 9A:
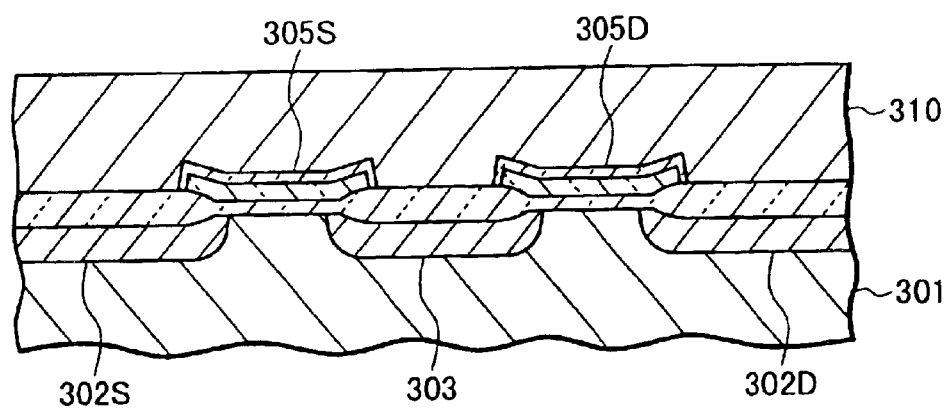
FIG. 9A is a cross sectional view of a semiconductor device of the fourth embodiment.

FIG. 9A is a cross sectional view showing one memory cell. The memory cell has: a source region 302S; a drain region 302D; an intermediate region 303; an ONO film 305S between the source region 302S and intermediate region 303; an ONO film 305D between the drain region 302D and intermediate region 303; and a gate line 310.

Figure 9B:
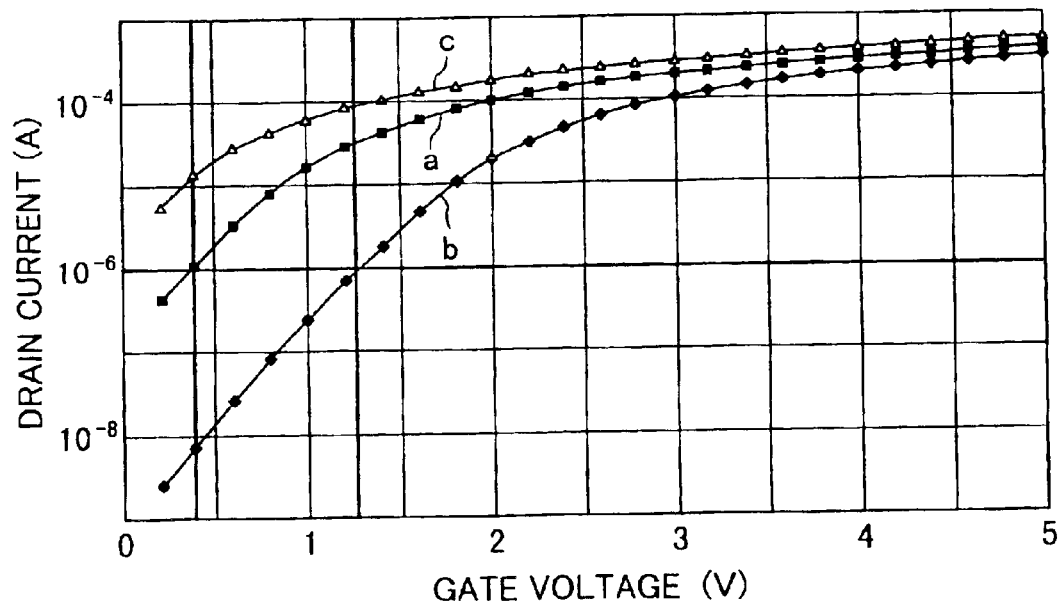
FIG. 9B is a graph showing the drain current characteristic.

FIG. 9B shows simulation results of the current characteristics of the memory cell shown in FIG. 9A at a source voltage of 0 V and a drain voltage of 2 V. The abscissa represents a gate voltage in the unit of "V" and the ordinate represents a drain current in the unit of "A". A curve a shows the state that electrons are trapped in the ONO film 305D on the drain region side, a curve b shows the state that electrons are trapped in the ONO film 305S on the source region side, and a curve c shows that electrons are trapped neither of the ONO films.

For example, if a distinction current between 0 and 1 is set to $1 \times 10^{-6}$ A, the state of the curve a and the state of the curve b can be distinguished with a sufficient margin. Namely, irrespective of whether electrons are trapped in the ONO film 305D on the drain region side, it is possible to judge whether electrons are trapped in the ONO film 305S on the source region side. If the source and drain voltages are reversed, it is possible to judge whether electrons are trapped in the ONO film on the drain region side.

In the fourth embodiment, as shown in FIG. 8C, the n-type intermediate region 303 is disposed in the central area of the channel region. Electrons trapped in the silicon nitride film 305B in the area overlapping the intermediate region 303 hardly influence the threshold value of FET. Therefore, even if the distribution of electrons trapped in the silicon nitride film 305B has its peak near the center of the channel region after repetition of write/erase operations, a change in the threshold value of FET can be suppressed.

Further, as shown in FIG. 3, although the impurity doped region 302 is connected to the overlaid wiring line, the intermediate region 303 is in a floating state. Since a via hole and the like are not necessary for the intermediate region 303, this region can be made to have a size of the shortest patterning width of photolithography processes. Therefore, as compared to using two FET's shown in FIG. 11A, the size of two FET's shown in FIG. 8C can be made small.

Next, a fifth embodiment of the invention will be described with reference to FIGS. 10A to 10E. The layout of the semiconductor device of the fifth embodiment as viewed in plan of the substrate is similar to that of the first embodiment shown in FIG. 1. FIGS. 10A to 10D correspond to the cross sectional views showing one FET and taken along one-dot chain line A2—A2 shown in FIG. 1, and FIG. 10E corresponds to the cross sectional view showing one channel stopper region and taken along one-dot chain line A13—A13 shown in FIG. 1. The method of manufacturing the semiconductor device and its structure according to the fifth embodiment will be described.

Figure 10A:
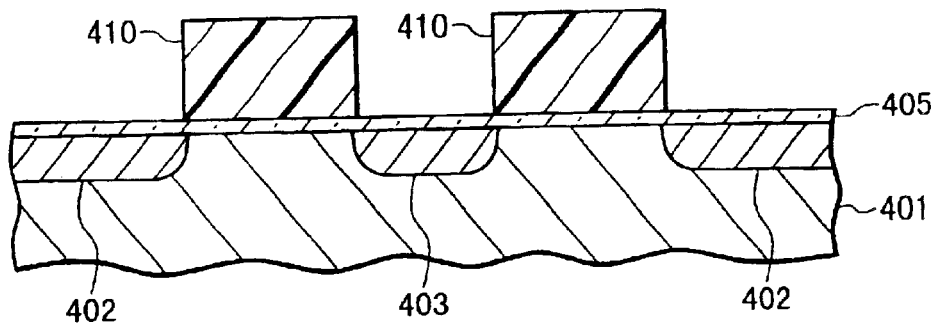
FIGS. 10A to 10E are cross sectional views of a substrate illustrating a method of manufacturing a semiconductor device according to a fifth embodiment.

As shown in FIG. 10A, the surface of a p-type silicon substrate 401 is thermally oxidized at a temperature of 800 to 1100° C. to form a through oxide film 405 of 5 to 10 nm in thickness on the surface of the active region. On the surface of the through oxide film 405, resist patterns 410 are formed. The resist patterns 410 have the same patterns as the resist patterns 330 of the fourth embodiment shown in FIG. 8A.

By using the resist patterns 410 as a mask, arsenic (As) ions are implanted in the surface layer of the silicon substrate 401. This ion implantation is performed under the conditions of an acceleration energy of 50 to 90 keV and a dose of $2 \times 10^{15}$ to $5 \times 10^{15}$ cm$^{-2}$. Outside of a pair of resist patterns 410, n-type impurity doped regions 402 are therefore formed, and between the pair of resist patterns 410, an n-type intermediate region 403 is formed.

Figure 10B:
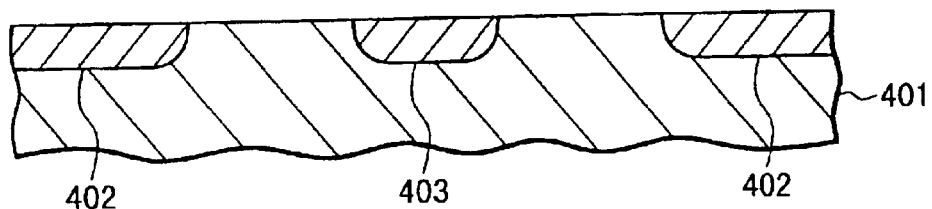

As shown in FIG. 10B, the resist patterns 410 are removed and then the through oxide film 405 is removed by using hydrofluoric acid. The surface of the substrate 401 is therefore exposed in the active region.

Figure 10C:
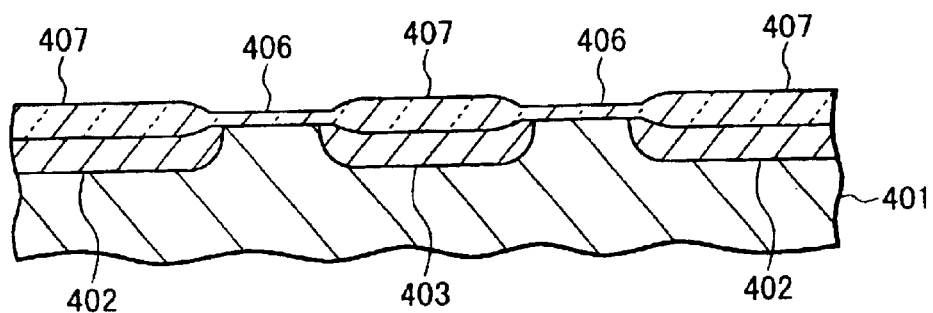

Processes up to the state shown in FIG. 10C will be described. The surface of the silicon substrate is thermally oxidized at a temperature of 800 to 1100° C. In the area where arsenic (As) ions are not implanted, a gate insulating film 406 having a thickness of 5 to 10 nm is formed, and on the surface of the impurity doped regions 402 and intermediate region 403 where arsenic (As) ions were implanted, an insulating film 407 of 40 to 60 nm in thickness is formed. At the boundary between the regions where arsenic (As) ions are not formed and were formed, a bird's beak is formed. After the thermal oxidation, the thin silicon oxide film formed in the area where arsenic (As) ions are not implanted, may be removed and then thermal oxidation is again performed to form the gate insulating film 406.

Figure 10D:
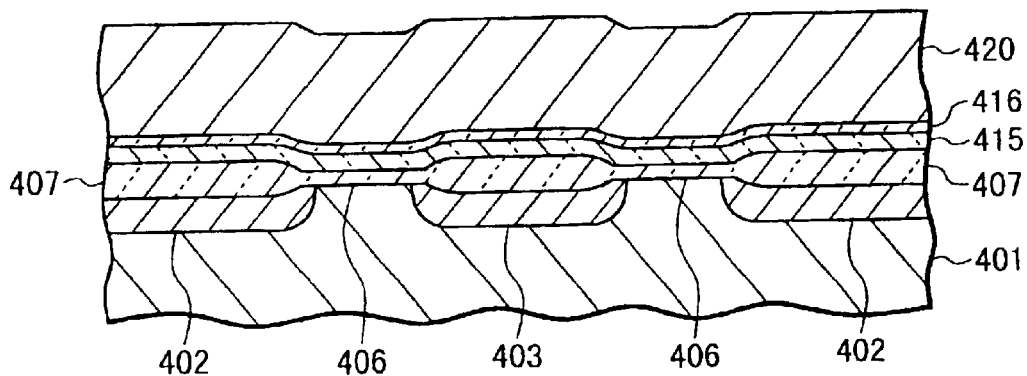

As shown in FIG. 10D, a silicon nitride film 415 and a silicon oxide film 416 are formed on the whole substrate surface. These two films are formed by processes similar to those of forming the silicon nitride film 6B and silicon oxide film 6C of the ONO film 6 shown in FIG. 5C.

Gate lines 420 are formed on the silicon oxide film 416. The gate line 420 is formed by processes similar to those of forming the gate line 206 shown in FIG. 7E.

Figure 10E:
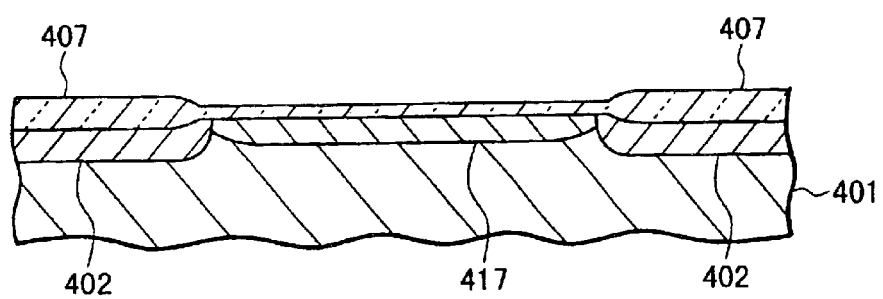

FIG. 10E is a cross sectional view showing the region between two adjacent gate lines 420 (corresponding to the cross sectional view taken along one-dot chain line A13—A13 shown in FIG. 1). By using the resist pattern used for pattering the gate lines 420, boron ions are implanted to form a channel stopper region 417.

In the fifth embodiment, similar to the fourth embodiment, the intermediate region 403 is disposed between a pair of impurity doped regions 402 as the source and drain regions. This intermediate region 403 is not connected to the overlaid wiring line and is an isolated pattern. Therefore, also in the fifth embodiment, similar advantages to those of the fourth embodiment can be expected.

In the above embodiments, data is stored by trapping electrons in the silicon nitride film of the ONO film. Instead of electrons, holes may be trapped to store data. Instead of the ONO film, a three-layer film made of insulating material may also be used. In this case, the middle layer of the lamination film is made of material easier to trap carriers than the other two layers.

The present invention has been described in connection with the preferred embodiments. The invention is not limited only to the above embodiments. It is apparent that various modifications, improvements, combinations, and the like can be made by those skilled in the art.

I claim:

1. A method of manufacturing a semiconductor device, comprising the steps of:

forming a two layer structure comprising a gate insulation film and a gate electrode on a partial area of a surface of a semiconductor substrate;

forming a lamination film on surfaces of the semiconductor substrate, gate insulating film and gate electrode conformable to the surfaces, the lamination film having a structure of at least three layers, each of the three layers being made of insulating material, and a middle layer being made of material easier to trap carriers than other two layers;

forming a conductive side wall spacer on a surface of the lamination film in areas along a side wall of the gate electrode;

etching the lamination film at least to a bottom of the middle layer in an area not covered with the side wall spacers;

implanting first impurities into a surface layer of the semiconductor substrate by using the gate electrode and the side wall spacer as a mask;

forming a first insulating film by locally oxidizing the surface of the semiconductor substrate not covered with the gate electrode and the side wall spacer;

removing an insulating film formed on an upper surface of the gate electrode and on a surface of the side wall spacer; and forming a connection member electrically connecting the upper surface of the gate electrode and the surface of the side wall spacer.

2. A method according to claim 1, wherein:

the two layer structure of the gate insulating film and gate electrode extends in a first direction on the surface of the semiconductor substrate and is formed in each of a plurality of areas disposed in parallel to each other; and said step of forming the connection member comprises:

a step of covering a whole surface of the semiconductor substrate with a conductive film;

a step of patterning the conductive film to leave a plurality of gate lines extending in a second direction crossing the first direction and disposed in parallel to each other;

a step of etching the gate electrode by using the gate lines as a mask after the gate lines are left; and a step of implanting second impurities of a conductivity type opposite to the first impurities into a surface layer of the semiconductor substrate under an area where the gate electrode was etched.

3. A method of manufacturing a semiconductor device, comprising the steps of:

forming a three layer structure comprising a gate insulation film on a gate electrode and a gate upper film partial area of a surface of a semiconductor substrate;

forming a lamination film of a lower layer, a middle layer and an upper layer, the lower layer covering exposed surfaces of at least the semiconductor substrate, gate insulating film and gate electrode, the middle layer covering surfaces of the lower layer and gate upper film, the upper layer covering the middle layer, each of the lower, middle and upper layers being made of insulating material, and the middle layer being made of material easier to trap carriers than the lower and upper layers;

forming a first conductive film covering a surface of the lamination film;

anisotropically etching the lamination film and first conductive film to leave a side wall spacer, which is made of a portion of the first conductive film, and a portion of the lamination film on a side wall of the gate electrode and gate upper film, and to remove at least the first conductive film and the upper and middle layers of the lamination film on the surface of the semiconductor substrate in an area where the gate electrode is not disposed;

implanting first impurities into a surface layer of the semiconductor substrate by using the gate electrode, gate upper film and side wall spacer as a mask;

forming a second film of insulating material on or over a whole surface of the semiconductor substrate;

polishing the second film until the gate upper film is exposed;

removing the gate upper film and the lamination film left on the side wall of the gate upper film; and forming a connection member electrically connecting an upper surface of the gate electrode and an exposed surface of the side wall spacer.

4. A method according to claim 3, wherein:

the three layer structure of the gate insulating film, gate electrode and gate upper film extends in a first direction on the surface of the semiconductor substrate and is formed on each of a plurality of areas disposed in parallel to each other; and said step of forming the connection member comprises:

a step of covering a whole surface of the semiconductor substrate with a third conductive film;

a step of patterning the third film to leave a plurality of gate lines extending in a second direction crossing the first direction and disposed in parallel to each other;

a step of etching the gate electrode, at least an upper layer of the second film and the side wall spacer by using the gate lines as a mask after the gate lines are left; and a step of implanting second impurities of a conductivity type opposite to the first impurities into a surface layer of the semiconductor substrate under an area where the gate electrode was etched.

* * * * *